(12) United States Patent
Jeong et al.

(10) Patent No.: US 10,109,588 B2
(45) Date of Patent: Oct. 23, 2018

(54) ELECTRONIC COMPONENT PACKAGE AND PACKAGE-ON-PACKAGE STRUCTURE INCLUDING THE SAME

(71) Applicant: SAMSUNG ELECTRO-MECHANICS CO., LTD., Suwon-si, Gyeonggi-do (KR)

(72) Inventors: Sung Won Jeong, Suwon-si (KR); Young Gwan Ko, Suwon-si (KR); Myung Sam Kang, Suwon-si (KR); Tae Hong Min, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/151,885

(22) Filed: May 11, 2016

(65) Prior Publication Data
US 2016/0336296 A1   Nov. 17, 2016

(30) Foreign Application Priority Data

May 15, 2015 (KR) .................. 10-2015-0067999
Oct. 13, 2015 (KR) .................. 10-2015-0142626

(51) Int. Cl.
*H01L 23/538* (2006.01)
*H01L 23/16* (2006.01)
(Continued)

(52) U.S. Cl.
CPC .......... *H01L 23/5389* (2013.01); *H01L 23/16* (2013.01); *H01L 23/49816* (2013.01);
(Continued)

(58) Field of Classification Search
None
See application file for complete search history.

(56) References Cited

U.S. PATENT DOCUMENTS 7,528,482 B2 * 5/2009 Huang .................... H01L 23/36
                                                      257/710
8,546,183 B2 * 10/2013 Huang ................ H01L 21/4871
                                                       438/106
(Continued)

FOREIGN PATENT DOCUMENTS

EP    1 536 673 A1    5/2005
JP    11-135681 A     5/1999
(Continued)

OTHER PUBLICATIONS

Office Action issued in corresponding Taiwanese Patent Application No. 105114641, dated Nov. 30, 2017, with English Translation.
(Continued)

*Primary Examiner* — Michael Lebentritt
*Assistant Examiner* — Jordan Klein
(74) *Attorney, Agent, or Firm* — McDermott Will & Emery LLP

(57) ABSTRACT

An electronic component package includes a frame containing a metal or ceramic based material and having a through-hole, an electronic component disposed in the through-hole, an insulating part at least covering upper portions of the frame and the electronic component, a bonding part at least partially disposed between the frame and the insulating part, and a redistribution part disposed at one side of the frame and the electronic component.

29 Claims, 34 Drawing Sheets

(51) Int. Cl.
  *H01L 23/00*    (2006.01)
  *H01L 25/10*    (2006.01)
  *H01L 23/498*   (2006.01)
  *H01L 23/31*    (2006.01)
  *H01L 23/13*    (2006.01)
  *H01L 23/36*    (2006.01)
  *H01L 21/56*    (2006.01)

(52) U.S. Cl.
  CPC .. *H01L 23/49822* (2013.01); *H01L 23/49827* (2013.01); *H01L 23/5383* (2013.01); *H01L 23/5384* (2013.01); *H01L 24/19* (2013.01); *H01L 24/20* (2013.01); *H01L 24/96* (2013.01); *H01L 24/97* (2013.01); *H01L 25/105* (2013.01); *H01L 21/568* (2013.01); *H01L 23/13* (2013.01); *H01L 23/3128* (2013.01); *H01L 23/36* (2013.01); *H01L 23/49811* (2013.01); *H01L 23/49866* (2013.01); *H01L 23/49894* (2013.01); *H01L 2224/04105* (2013.01); *H01L 2224/12105* (2013.01); *H01L 2224/16227* (2013.01); *H01L 2225/1035* (2013.01); *H01L 2225/1041* (2013.01); *H01L 2225/1058* (2013.01); *H01L 2924/145* (2013.01); *H01L 2924/1431* (2013.01); *H01L 2924/1432* (2013.01); *H01L 2924/1433* (2013.01); *H01L 2924/1436* (2013.01); *H01L 2924/1438* (2013.01); *H01L 2924/14335* (2013.01); *H01L 2924/15311* (2013.01); *H01L 2924/15321* (2013.01); *H01L 2924/19041* (2013.01); *H01L 2924/19042* (2013.01); *H01L 2924/19043* (2013.01); *H01L 2924/19105* (2013.01); *H01L 2924/3511* (2013.01)

(56) References Cited

U.S. PATENT DOCUMENTS

| | | | | |
|---|---|---|---|---|
| 8,736,033 | B1* | 5/2014 | Chuo | H01L 23/552 257/659 |
| 9,209,154 | B2* | 12/2015 | Lin | H01L 24/81 |
| 2003/0015342 | A1* | 1/2003 | Sakamoto | H01L 21/4846 174/250 |
| 2005/0231922 | A1* | 10/2005 | Chang | H01L 23/5385 361/750 |
| 2006/0012017 | A1* | 1/2006 | Fujisawa | H01L 24/24 257/678 |
| 2008/0099911 | A1* | 5/2008 | Machida | H01L 23/13 257/723 |
| 2008/0099912 | A1 | 5/2008 | Wu | |
| 2008/0197478 | A1 | 8/2008 | Yang et al. | |
| 2008/0289853 | A1* | 11/2008 | Sakai | H01L 23/49822 174/126.2 |
| 2009/0244865 | A1* | 10/2009 | Tanaka | H01L 23/5389 361/764 |
| 2009/0293271 | A1* | 12/2009 | Tanaka | H01L 23/49827 29/832 |
| 2010/0006330 | A1 | 1/2010 | Fu et al. | |
| 2010/0078786 | A1* | 4/2010 | Maeda | H01L 23/16 257/678 |
| 2010/0301474 | A1* | 12/2010 | Yang | H01L 21/6835 257/737 |
| 2011/0259630 | A1* | 10/2011 | Park | H01L 23/13 174/260 |
| 2012/0024582 | A1* | 2/2012 | Maeda | H01L 21/4857 174/258 |
| 2012/0081864 | A1* | 4/2012 | Sakurai | H01L 23/49822 361/753 |
| 2012/0188734 | A1* | 7/2012 | Mikado | H05K 1/185 361/761 |
| 2014/0048944 | A1 | 2/2014 | Lin et al. | |
| 2014/0070396 | A1* | 3/2014 | Kyozuka | H01L 24/19 257/698 |
| 2015/0130046 | A1 | 5/2015 | Lin et al. | |
| 2015/0137338 | A1* | 5/2015 | Lin | H01L 23/49816 257/676 |
| 2016/0307847 | A1* | 10/2016 | Lee | H01L 23/5389 |
| 2016/0336249 | A1* | 11/2016 | Kang | H01L 23/3128 |
| 2017/0133309 | A1* | 5/2017 | Kim | H01L 23/3128 |
| 2017/0148699 | A1* | 5/2017 | Seo | H01L 23/3128 |

FOREIGN PATENT DOCUMENTS

| | | |
|---|---|---|
| JP | 2003-309213 A | 10/2003 |
| JP | 2003-347741 A | 12/2003 |
| JP | 2004-071698 A | 3/2004 |
| JP | 2010-073851 A | 4/2010 |
| JP | 2011-211099 A | 11/2011 |
| JP | 2013-211480 A | 10/2013 |
| KR | 10-2013-0132161 A | 12/2013 |
| KR | 10-2013-0132162 A | 12/2013 |
| KR | 10-2013-0132163 A | 12/2013 |
| TW | 200836320 A | 9/2008 |
| TW | 200901417 A | 1/2009 |
| TW | 201019438 A | 5/2010 |
| TW | 201407733 A | 2/2014 |
| WO | 2006/043474 A1 | 4/2006 |

OTHER PUBLICATIONS

Taiwan Office Action issued in corresponding Taiwan Patent Application No. 105114641, dated Mar. 26, 2018, with English Translation.

Japanese Office Action issued in corresponding Japanese Patent Application No. 2016-096403, dated May 8, 2018, with English Translation.

* cited by examiner

I - I'

III - III'

V - V'

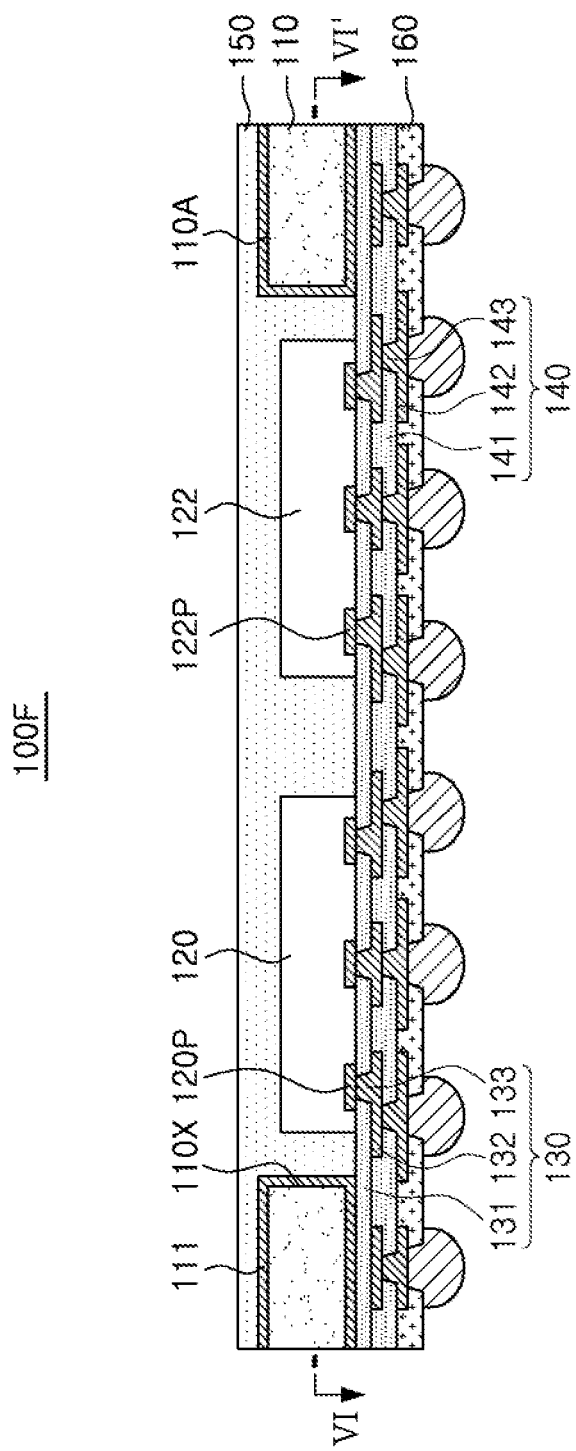

VI – VI'

VII - VII'

VIII - VIII'

ELECTRONIC COMPONENT PACKAGE AND PACKAGE-ON-PACKAGE STRUCTURE INCLUDING THE SAME

CROSS-REFERENCE TO RELATED APPLICATIONS

This application claims the priorities and benefits of Korean Patent Application Nos. 10-2015-0067999 filed on May 15, 2015 and 10-2015-0142626 filed on Oct. 13, 2015 with the Korean Intellectual Property Office, the disclosures of which are incorporated herein by reference.

TECHNICAL FIELD

The present disclosure relates to an electronic component package, a package-on-package structure including the same.

BACKGROUND

An electronic component package is defined as package technology electrically connecting an electronic component to a printed circuit board (PCB), such as a main board of an electronic device, or the like, and protecting the electronic component from external impacts, and is distinguished from technology of embedding an electronic component in a printed circuit board, such as an interposer substrate. Meanwhile, one significant recent trend in the development of technology related to electronic components is to reduce the size of electronic components. As such, in a package field, and in accordance with a rapid increase in demand for miniaturized electronic components, or the like, implementation of an electronic component package having a compact size and including a plurality of pins has been demanded.

One package technology suggested in order to satisfy the technical demand as described above is a wafer level package (WLP) using a redistribution wiring of an electrode pad of an electronic component formed on a wafer. An example of the wafer level package includes a fan-in wafer level package and a fan-out wafer level package. In particular, the fan-out wafer level package has a reduced size and is advantageous in implementing a plurality of pins. Therefore, recently, the fan-out wafer level package has been actively developed.

Meanwhile, in accordance with performance improvement of the electronic components, a heat dissipation structure that may effectively process heat generated in the electronic component has become important. In addition, there is a need to significantly reduce the occurrence of warpage due to a difference between coefficients of thermal expansion (CTEs) of components configuring the electronic component package.

SUMMARY

An aspect of the present disclosure may provide an electronic component package having improved heat dissipation and warpage characteristics, and a package-on-package structure including the same.

According to an aspect of the present disclosure, a frame that may reinforce rigidity of an electronic component package using a material having excellent heat dissipation characteristics and may be appropriate for improving warpage characteristics, such as an Fe—Ni based alloy, a ceramic based material, or the like, may be introduced.

BRIEF DESCRIPTION OF DRAWINGS

The above and other aspects, features, and advantages of the present disclosure will be more clearly understood from the following detailed description taken in conjunction with the accompanying drawings, in which:

FIG. 20 is a cross-sectional view schematically illustrating another example of an electronic component package;

DETAILED DESCRIPTION

Hereinafter, the present disclosure will be described with reference to the accompanying drawings. In the accompanying drawings, shapes and dimensions of components may be exaggerated and shortened for clarity.

Electronic Device

Figure 1:
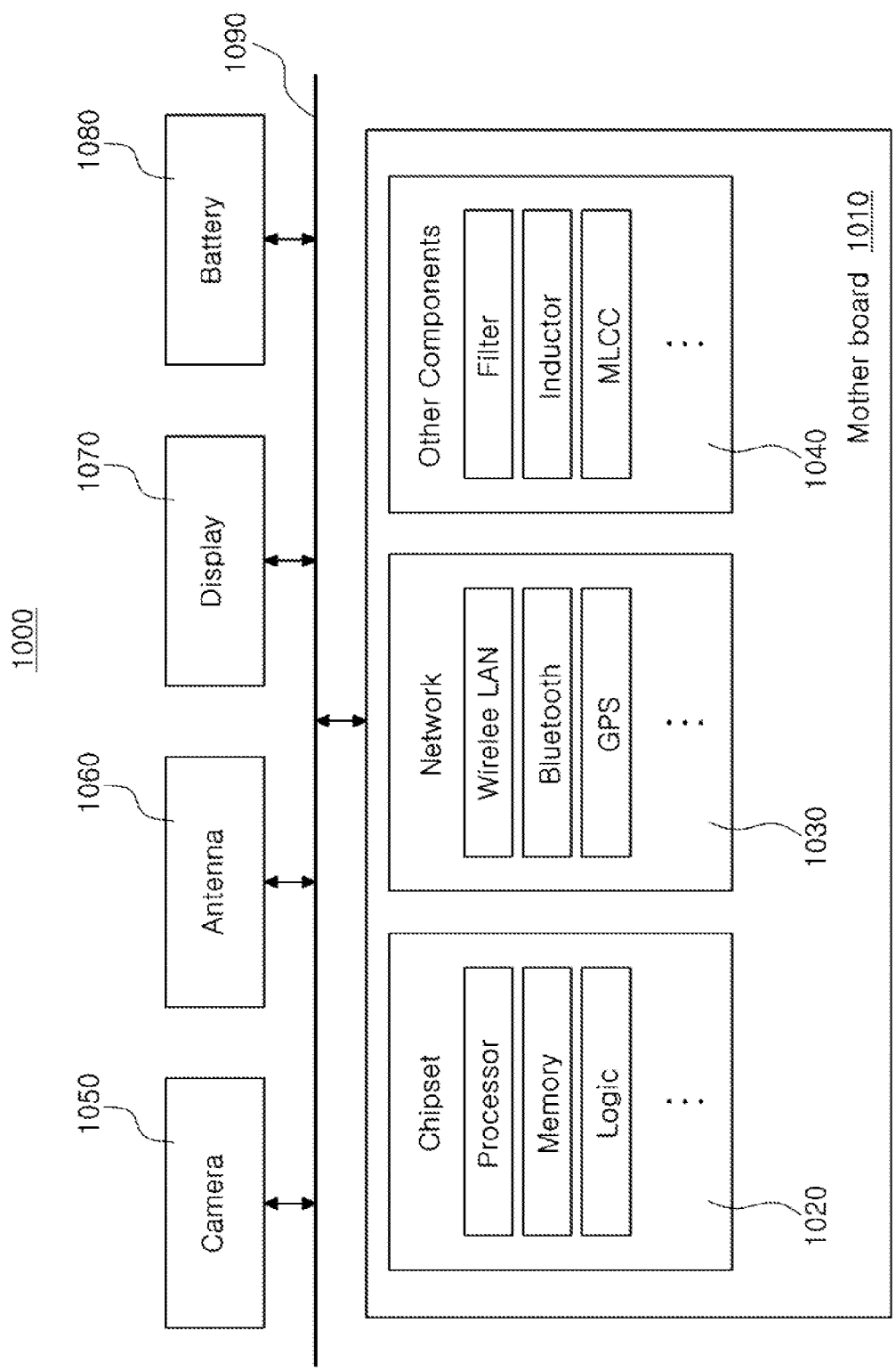
FIG. 1 is a block diagram schematically illustrating an example of an electronic device system.

FIG. 1 is a block diagram schematically illustrating an example of an electronic device system. Referring to FIG. 1, an electronic device 1000 may accommodate a mother board 1010 therein. Chip related components 1020, network related components 1030, other components 1040, and the like, may be physically and/or electrically connected to the mother board 1010. These components may be connected to other components to be described below to form various signal lines 1090.

The chip related components 1020 may include a memory chip such as a volatile memory (for example, a dynamic random access memory (DRAM)), a non-volatile memory (for example, a read only memory (ROM)), a flash memory, etc.; an application processor chip such as a central processor (for example, a central processing unit (CPU)), a graphics processor (for example, a graphic processing unit (GPU)), a digital signal processor, a cryptographic processor, a micro processor, a micro controller, etc.; a logic chip such as an analog-to-digital converter, an application-specific integrated circuit (ASIC), etc., and the like. However, the chip related components 1020 are not limited thereto, and may also include other types of chip related components. In addition, these components 1020 may be combined with each other.

The network related components 1030 may include protocols such as wireless fidelity (Wi-Fi) (Institute of Electrical and Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, 5G protocols and any other wireless and wired protocols designated after the above-mentioned protocols. However, the network related components 1030 are not limited thereto, and may also include any of a plurality of other wireless or wired standards or protocols. In addition, these components 1030 may be combined with each other together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, these components 1040 may be combined with each other together with the chip related components 1020 and/or the network related components 1030 described above.

The electronic device 1000 may include other components that may or may not be physically and/or electrically connected to the mother board 1010 depending on a kind thereof. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage (for example, a hard disk drive) (not illustrated), a compact disk (CD) (not illustrated), a digital versatile disk (DVD) (not illustrated), and the like. However, these other components are not limited thereto, and may also include other components used for various purposes depending on a kind of electronic device 1000.

The electronic device 1000 may be a smartphone, a personal digital assistant, a digital video camera, a digital still camera, a network system, a computer, a monitor, a tablet, a laptop, a netbook, a television, a video game console, a smart watch, or the like. However, the electronic device 1000 is not limited thereto, and may also be any other electronic device processing data.

Figure 2:
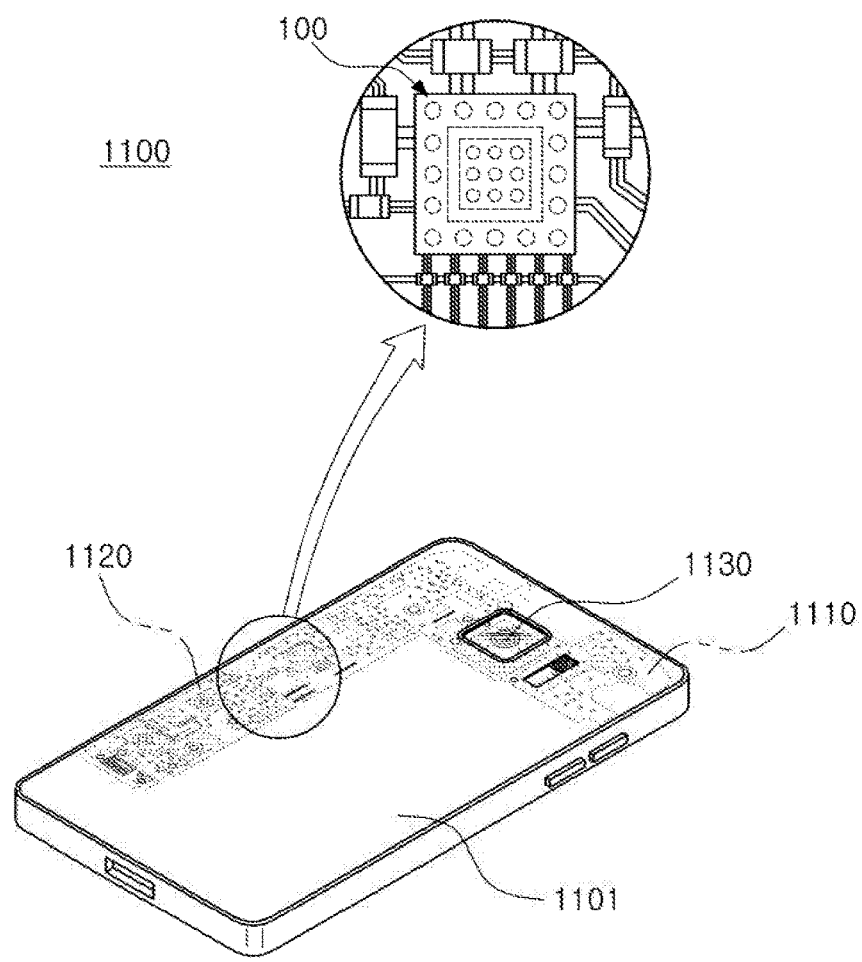
FIG. 2 is a view schematically illustrating an example of an electronic component package used in an electronic device.

FIG. 2 is a view schematically illustrating an example of an electronic component package used in an electronic device. The electronic component package may be used for various purposes in the various electronic devices 1000 as described above. For example, a main board 1110 may be accommodated in a body 1101 of a smartphone 1100, and various electronic components 1120 may be physically and/or electrically connected to the main board 1110. In addition, another component that may be or may not be physically and/or electrically connected to the main board 1110, such as a camera 1130, may be accommodated in the body 1101. Here, some of the electronic components 1120 may be the chip related components as described above, and the electronic component package 100 may be, for example, an application processor among the chip related components, but are not limited thereto.

Electronic Component Package

Figure 3:
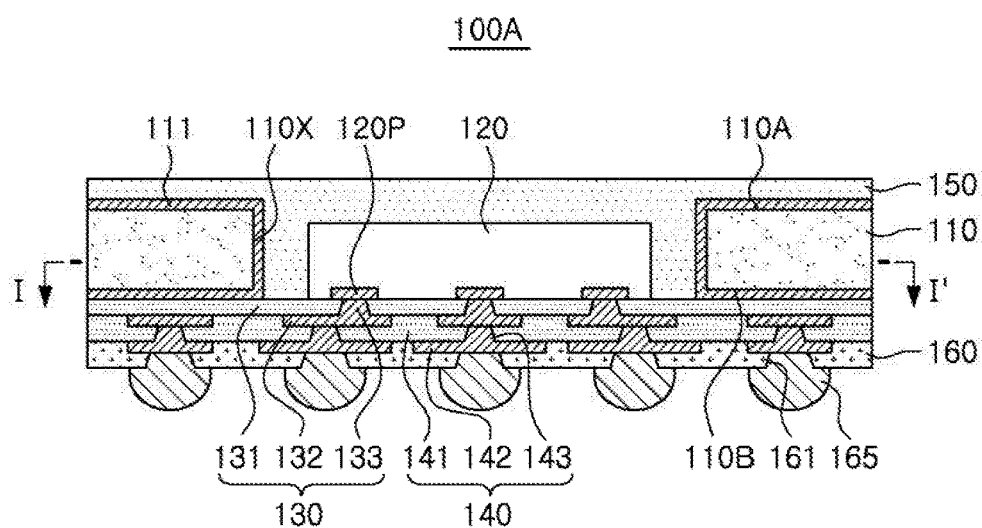
FIG. 3 is a cross-sectional view schematically illustrating an example of an electronic component package.
Figure 4:
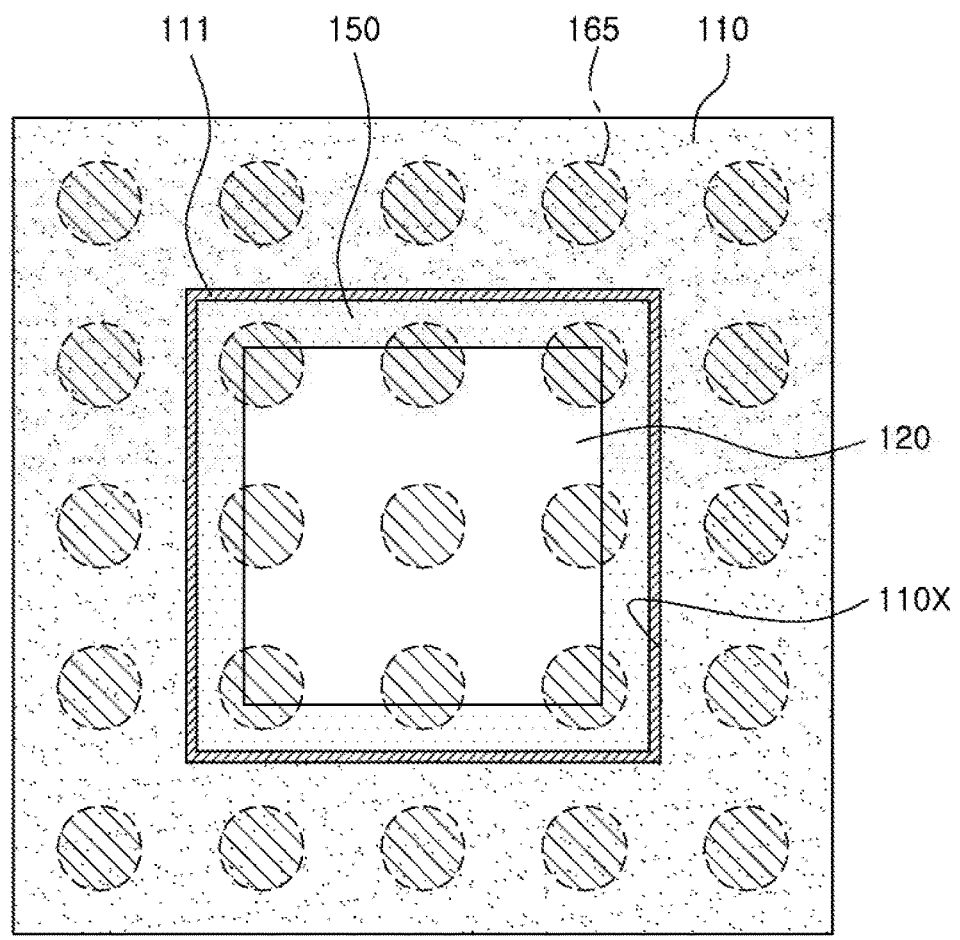
FIG. 4 is a schematic plan view of the electronic component package taken along line I-I' of FIG. 3.

FIG. 3 is a cross-sectional view schematically illustrating an example of an electronic component package. FIG. 4 is a schematic plan view of the electronic component package taken along line I-I' of FIG. 3. Referring to FIGS. 3 and 4, an electronic component package 100A according to an example may include a frame 110 having a through-hole 110X, an electronic component 120 disposed in the through-hole 110X, an insulating part 150 at least covering upper portions of the frame 110 and the electronic component 120, a bonding part 111 at least partially disposed between the frame 110 and the insulating part 150, and redistribution parts 130 and 140 disposed below the frame 110 and the electronic component 120.

The purpose of the frame 110 may be to support the electronic component package 100A, and rigidity of the electronic component package 100A may be maintained and uniformity of a thickness of the electronic component package 100A may be secured by the frame 110. The frame 110 may have an upper surface 110A and a lower surface 110B opposing the upper surface 110A. Here, the through-hole 110X may penetrate between the upper surface 110A and the lower surface 110B. The electronic component 120 may be disposed in the through-hole 110X.

The frame 110 may contain a metal or ceramic based material. Since a difference between coefficients of thermal expansion (CTEs) of the frame 110 and the electronic component 120 may be significantly reduced, warpage of the electronic component package 100A may be reduced. In addition, since the metal or ceramic based material has thermal conductivity greater than that of a general molding resin, pre-preg, or the like, heat dissipation characteristics may also be improved. In addition, as a process of forming the through-hole 110X, an etching process rather than a laser drill process may be performed. Therefore, a defect caused by a foreign material may be fundamentally removed. As the metal or ceramic based material, an alloy having excellent rigidity and thermal conductivity may be used. Here, the alloy may be an alloy containing at least iron, such as an Fe—Ni based alloy (Invar), but is not limited thereto. Alternatively, in a case in which a ceramic based material such as a zirconia based ($ZrO_2$) material, an alumina based ($Al_2O_3$) material, a silicon carbide based (SiC) material, a silicon nitride based ($Si_3N_4$) material, or the like, is used instead of the alloy, the same effect may be accomplished.

A material of the frame 110 may have thermal conductivity of 1 W/mK or more, for example, about 10 W/mK to 15 W/mK. The general molding resin, pre-preg, or the like, which has thermal conductivity less than 1 W/mK, is significantly vulnerable to heat dissipation. However, in a case in which the frame 110 contains the metal or ceramic based material having excellent thermal conductivity, the thermal conductivity of the metal or ceramic based material is high (1 W/mK or more), and thus heat dissipation characteristics may be improved. The thermal conductivity may be measured using a thermal conductivity measurement tool well-known in the related art.

A CTE of the material of the frame 110 may be 10 ppm/° C. or less, for example, about 1 ppm/° C. to 8 ppm/° C. The electronic component, such as an integrated circuit, has a CTE of about 2 ppm/° C. to 3 ppm/° C., while the general molding resin, pre-preg, or the like, has a high CTE of 12 ppm/° C. to 50 ppm/° C. Therefore, a difference between the CTEs of the electronic component and the general molding resin, prepreg, or the like, may be large, and thus warpage may be easily generated. Conversely, in the case in which the frame 110 contains the metal or ceramic based material, the CTE of the frame may be reduced to 10 ppm/° C. or less. As a result, a difference between the CTEs of the frame and the electronic component may be significantly reduced, and thus warpage of the electronic component package between processes or warpage of a completed product of the electronic component package may be improved. The CTE may be measured using a thermo-mechanical analyzer, or the like, in a temperature range of, for example, 100° C. to 400° C.

The material of the frame 110 may have an elastic modulus of 100 GPa or more, such as about 130 GPa to 160 GPa. The general molding resin, pre-preg, or the like, has an elastic modulus of several tens of GPa. Therefore, it is difficult to maintain rigidity. Conversely, in a case in which the material of the frame 110 has the elastic modulus of 100 GPa or more, the rigidity may be additionally secured, and thus a process property may be improved, and the warpage of the completed product of the electronic component package may be reduced. The elastic module is defined as a ratio between stress and deformation, and may be measured through a tension test specified in KS M 3001, KS M 527-3, ASTM D882, and the like.

A thickness of the frame 110 in a cross section thereof is not particularly limited, and may be designed depending on a thickness of the electronic component 120 in a cross section thereof. For example, a thickness of the frame 110 may be about 100 μm to 500 μm depending on a kind of electronic component 120.

The bonding part 111 may facilitate bonding between the frame 110 and the insulating part 150. The bonding part 111 may be disposed between at least the frame 110 and the insulating part 150, and may be formed on, for example, the upper surface 110A and/or the lower surface 110B of the frame 110. In addition, the bonding part 111 may also be formed on an inner wall of the through-hole 110X. The bonding part 111 may be formed of a conductive material, such as copper (Cu), aluminum (Al), silver (Ag), tin (Sn), gold (Au), nickel (Ni), lead (Pd), or alloys thereof. The bonding part 111 may have a thermal conductivity greater than that of the metal or ceramic based material for forming the frame 110. Therefore, heat dissipation characteristics of the electronic component package 100A may be improved through the bonding part 111 formed on the inner wall of the through-hole 110X, and the like.

The bonding part 111 may be connected to a redistribution pattern serving as a ground (GND) pattern in a conductive pattern 132 of the redistribution layer 130. The heat emitted from the electronic component 120 may be conducted to the ground (GND) pattern in the conductive pattern 132 through the bonding part 111 to thereby be dissipated to a lower portion of the electronic component package 100A. The ground (GND) pattern may also serve to block electromagnetic waves. However, the heat is not necessarily limited to being dissipated as described above, and may be dissipated to the lower portion by radiation, convection, or the like, even in a case in which the bonding part 111 is not connected to the redistribution pattern of the redistribution layer 130.

The electronic component 120 may be various active components (such as a diode, a vacuum tube, a transistor, and the like) or passive components (such as an inductor, a condenser, a resistor, and the like). Alternatively, the electronic component 120 may be an integrated circuit (IC) chip indicating a chip in which hundreds to millions or more of elements are integrated. The electronic component 120 may be an electronic component in which an integrated circuit is packaged in a flip-chip form, if necessary. The integrated circuit may be an application processor chip such as a central processor (such as a CPU), a graphics processor (such as a GPU), a digital signal processor, a cryptographic processor, a micro processor, a micro controller, or the like, but is not limited thereto.

The electronic component 120 may have electrode pads 120P electrically connected to the redistribution parts 130 and 140. The purpose of the electrode pad 120P may be to electrically connect the electronic component 120 externally, and a material of the electrode pad 120P is not particularly limited as long as it is a conductive material. For example, the conductive material may be copper (Cu), aluminum (Al), silver (Ag), tin (Sn), gold (Au), nickel (Ni), lead (Pd), or alloys thereof, but is not limited thereto. The electrode pad 120P may be redistributed by the redistribution parts 130 and 140. The electrode pad 120P may have an embedded form or a protruding form.

In the case in which the electronic component 120 is the integrated circuit, the electronic component 120 may have a body (not denoted by a reference number), a passivation layer (not denoted by a reference number), and the electrode pads 120P. The body may be formed on the basis of, for example, an active wafer. In this case, silicon (Si), germanium (Ge), gallium arsenide (GaAs), or the like, may be used as a basic material of the body. The passivation layer may serve to protect the body from external factors, and may be formed of, for example, an oxide layer, a nitride layer, or the like, or may be formed of a double layer of an oxide layer and a nitride layer. A conductive material such as copper (Cu), aluminum (Al), silver (Ag), tin (Sn), gold (Au), nickel (Ni), lead (Pd), or alloys thereof, may be used as a material of the electrode pad 120P. A layer on which the electrode pads 120P are formed may become an active layer.

A thickness of the electronic component 120 in a cross section thereof is not particularly limited, and may be changed depending on a kind of electronic component 120. For example, in a case in which the electronic component 120 is the integrated circuit, a thickness of the electronic component 120 may be about 100 μm to 480 μm, but is not limited thereto. To accommodate the electronic component 120 within the through-hole 110X of the frame 110, the frame 110 may include any layer that is penetrated through by the through-hole 110X and has a distance from the redistribution parts 130 and 140 no more than a distance between an upper surface of the electronic component 120 opposing to a lower surface thereof on which the electrode pads 120P are formed.

The purpose of the redistribution parts 130 and 140 may be to redistribute the electrode pads 120P of the electronic component 120. Tens to hundreds of electrode pads 120P having various functions may be redistributed through the redistribution parts 130 and 140, and may be physically and/or electrically connected externally through first external connection terminals 165 to be described below depending on functions thereof.

The redistribution parts 130 and 140 may be formed of redistribution layers 130 and 140 each including insulating layers 131 and 141, conductive patterns 132 and 142 disposed on the insulating layers 131 and 141, and conductive vias 133 and 143 penetrating through the insulating layers 131 and 141. Although the redistribution parts 130 and 140 are formed of a plurality of redistribution layers 130 and 140, respectively, in the electronic component package 100A according to an example, the redistribution parts 130 and 140 are not limited thereto, and may be formed of a single redistribution layer unlike as illustrated in FIGS. 3 and 4. In addition, the redistribution parts 130 and 140 may also be formed of a plurality of redistribution layers having more layers depending on design particulars.

An insulating material may be used as materials of the insulating layers 131 and 141. Here, the insulating material may be a thermosetting resin such as an epoxy resin, a thermoplastic resin such as a polyimide resin, a resin having a reinforcement material such as a glass fiber or an inorganic filler impregnated in the thermosetting resin and the thermoplastic resin, such as pre-preg, Ajinomoto Buildup Film (ABF), FR-4, Bismaleimide Triazine (BT), or the like. In a case in which a photosensitive insulating material such as a photo imagable dielectric (PID) resin is used as materials of the insulating layers 131 and 141, the insulating layers 131 and 141 may be formed at a reduced thickness, and a fine pitch may be easily implemented. Materials of the insulating layers 131 and 141 may be the same as each other or may be different from each other, if necessary. Thicknesses of the insulating layers 131 and 141 are also not particularly limited. For example, thicknesses of the insulating layers 131 and 141 except for the conductive patterns 132 and 142 may be about 5 μm to 20 μm, and thicknesses of the insulating layers 131 and 141 when considering thicknesses of the conductive patterns 132 and 142 may be about 15 μm to 70 μm.

The conductive patterns 132 and 142 may also serve as a redistribution pattern and/or a pad pattern, and a conductive material such as copper (Cu), aluminum (Al), silver (Ag), tin (Sn), gold (Au), nickel (Ni), lead (Pd), or alloys thereof, may be used as materials of the conductive patterns 132 and 142. The conductive patterns 132 and 142 may perform various functions depending on a design of the corresponding layer. For example, the first wiring layer 112B may serve as a ground (GND) pattern, a power (PWR) pattern, a signal (S) pattern, and the like, as redistribution patterns. Here, the signal (S) pattern may include various signals except for the ground (GND) pattern, the power (PWR) pattern, and the like, for such as data signals, and the like. In addition, the conductive patterns 132 and 142 may serve as a via pad, an external connection terminal pad, or the like, as a pad pattern. Thicknesses of the conductive patterns 132 and 142 are also not particularly limited, but may be, for example, about 10 μm to 50 μm.

A surface treatment layer may be further formed on exposed portions of the conductive pattern 142, if necessary. The surface treatment layer is not particularly limited as long as it is known in the related art, and may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The conductive vias 133 and 143 may electrically connect the conductive patterns 132 and 142 formed on different layers to each other, as well as the electrode pads 120P, and the like, thereby forming an electrical path within the electronic component package 100A. A conductive material such as copper (Cu), aluminum (Al), silver (Ag), tin (Sn), gold (Au), nickel (Ni), lead (Pd), or alloys thereof, may be used as materials of the conductive vias 133 and 143. The conductive vias 133 and 143 may also be completely filled with a conductive material. Alternatively, a conductive material may be formed along walls of the conductive vias 133 and 143. In addition, the conductive vias 133 and 143 may have all of the shapes known in the related art, such as a tapered shape in which a diameter of the via becomes smaller toward a lower surface, a reverse tapered shape in which a diameter of the via becomes larger toward a lower surface, a cylindrical shape, and the like.

The purpose of the insulating part 150 may be to basically protect the electronic component 120. To this end, the insulating part 150 may cover the electronic component 120. A covering form is not particularly limited, and may be a form enclosing the electronic component 120. In the electronic component package 100A according to an example, the insulating part 150 may also cover the frame 110. Here, the meaning that the insulating part 150 covers a target component is that the insulating part 150 indirectly covers the target component without directly contacting the target component due to a separate component interposed between the insulating part 150 and the target component as well as that the insulating part 150 directly covers the target component. That is, the covering form may be any form protecting at least an upper portion of the target component. For example, even in a case in which the bonding part 110, or the like, is formed on the upper surface 110A of the frame 110 and/or the inner wall of the through-hole 110X, as illustrated in FIGS. 3 and 4, it may be interpreted that the insulating part 150 covers the frame 110. Meanwhile, the insulating part 150 may be provided in the remaining space within the through-hole 110X of the frame 110. In this case, the insulating part 150 may serve as an adhesive depending on a detailed material thereof, and may also serve to reduce buckling of the electronic component 120.

The insulating part 150 may include a plurality of layers formed of a plurality of materials. For example, a space within the through-hole 110X may be filled with a first insulating part, and the frame 110 and the electronic component 120 may be covered with a second insulating part. Alternatively, the frame 110 and the electronic component 120 may be covered at a predetermined thickness while filling the space within the through-hole 110X using the first insulating part, and the second insulating part may be again covered at a predetermined thickness on the first insulating part. In addition to the form described above, various forms may be used.

A specific material of the insulating part 150 is not particularly limited. For example, an insulating material may be used as a material of the insulating part 150. Here, the insulating material may be a thermosetting resin such as an epoxy resin, a thermoplastic resin such as a polyimide resin, a resin having a reinforcement material such as a glass fiber or an inorganic filler impregnated in the thermosetting resin and the thermoplastic resin, such as pre-preg, ABF, FR-4, BT, a PID resin, or the like. In addition, a known molding material such as an EMC, or the like, may also be used.

The insulating part 150 may have an elastic modulus lower than that of a material of the frame 110. For example, an elastic modulus of the insulating part 150 may be 15 GPa or less, such as about 50 MPa to 15 GPa. As the elastic modulus of the insulating part 150 becomes relatively small, warpage of the electronic component package 100A may be reduced through a buckling effect and a stress dispersing effect for the electronic component 120. In detail, since the insulating part 150 is provided in the space of the through-hole 110X, the insulating part 150 may have the buckling effect for the electronic component 120, and since the insulating part 150 encapsulates the electronic component 120, the insulating part 150 may disperse and alleviate stress generated in the electronic component 120. However, in a case in which the elastic modulus of the insulating part 150 is excessively small, the insulating part 150 may be excessively deformed, and thus the insulating part 150 may not perform a basic role thereof.

The insulating part 150 may contain conductive particles in order to block electromagnetic waves, if necessary. For example, the conductive particle may be any material that may block electromagnetic waves, such as copper (Cu), aluminum (Al), silver (Ag), tin (Sn), gold (Au), nickel (Ni), lead (Pd), solder, or the like, but is not particularly limited thereto.

An interval of the space within the through-hole 110X filled with the insulating part 150 is not particularly limited, and may be optimized by those skilled in the art. For example, an interval of the space within the through-hole 110X filled with the insulating part 150 may be about 10 μm to 150 μm, but is not limited thereto.

The electronic component package 100A according to an example may further include an outer layer 160 disposed below the redistribution parts 130 and 140. The purpose of the outer layer 160 may be to protect the redistribution parts 130 and 140 from external physical or chemical damage, or the like. The outer layer 160 may have first opening parts 161 exposing at least portions of the conductive pattern 142 of the redistribution layer 140 of the redistribution parts 130 and 140. Although the first opening parts 161 may expose portions of an upper surface of the conductive pattern 142, the first opening parts 161 may also expose side surfaces of the conductive pattern 142 in some cases.

A material of the outer layer 160 is not particularly limited. For example, a solder resist may be used as a material of the outer layer 160. In addition, the same material as that of the insulating layers 131 and 141 of the redistribution parts 130 and 140, such as the same PID resin, may also be used as a material of the outer layer 160. The outer layer 160 is generally a single layer, but may also be formed of multiple layers, if necessary.

The electronic component package 100A according to an example may further include first external connection terminals 165 externally exposed an opposite surface of the outer layer 160 opposing a surface of the outer layer 160 connected to the redistribution layer 140. The purpose of the first external connection terminals 165 may be to physically and/or electrically externally connect the electronic component package 100A. For example, the electronic component package 100A may be mounted on the main board of the electronic device through the first external connection terminals 165. The first external connection terminals 165 may be disposed in the first opening parts 161, and may be connected to the conductive pattern 142 exposed through the first opening part 161. Therefore, the first external connection terminals 165 may also be electrically connected to the electronic component 120.

The first external connection terminal 165 may be formed of a conductive material, such as copper (Cu), aluminum (Al), silver (Ag), tin (Sn), gold (Au), nickel (Ni), lead (Pd), solder, or the like, but is not particularly limited thereto. The first external connection terminal 165 may be a land, a ball, a pin, or the like. The first external connection terminal 165 may be formed of multiple layers or a single layer. In a case in which the first external connection terminal 165 is formed of multiple layers, the first external connection terminal 165 may contain a copper pillar and a solder, and in a case in which the first external connection terminal 165 is formed of a single layer, the first external connection terminal 165 may contain a tin-silver solder or copper. However, this is only an example, and the first external connection terminal 165 is not limited thereto.

Some of the first external connection terminals 165 may be disposed in a fan-out region. The fan-out region is defined as a region except for a region in which the electronic component is disposed. That is, the electronic component package 100A according to an example may be a fan-out package. The fan-out package may have reliability greater than that of a fan-in package, may implement a plurality of I/O terminals, and may easily perform 3D interconnection. In addition, since the fan-out package may be mounted on the electronic device without using a separate substrate as compared to a ball grid array (BGA) package, a land grid array (LGA) package, or the like, the fan-out package may be manufactured at a reduced thickness, and may have excellent price competitiveness.

The number, an interval, a disposition form, and the like, of first external connection terminals 165 are not particularly limited, and may be sufficiently modified depending on design particulars by those skilled in the art. For example, the number of first external connection terminals 165 may be several ten to several thousand depending on the number of electrode pads 120P of the electronic component 120. However, the number of first external connection terminals 165 is not limited thereto, and may also be several ten to several thousand or more or several ten to several thousand or less.

FIGS. 5A through 5E are schematic views illustrating examples of processes of manufacturing the electronic component package 100A according to an example.

Figure 5A:
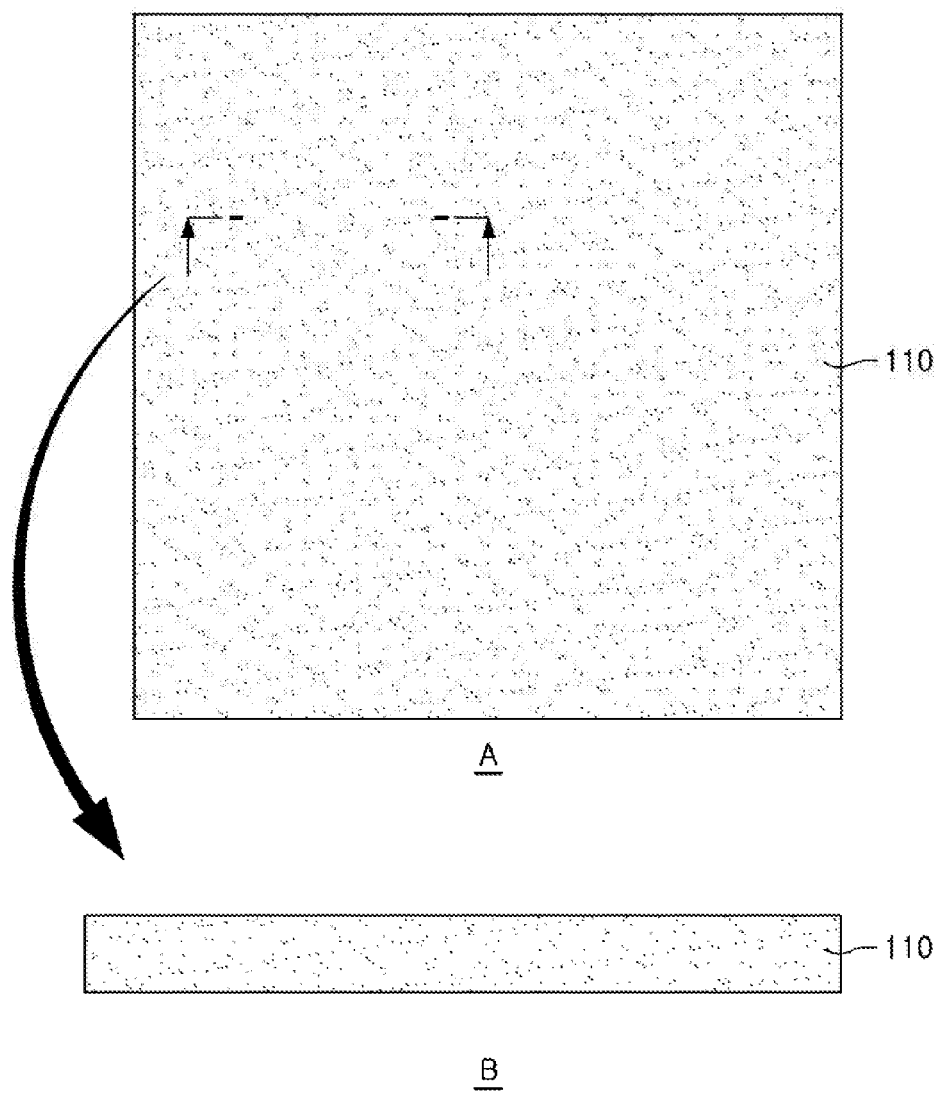
FIGS. 5A through 5E are schematic views illustrating examples of processes of manufacturing the electronic component package of FIG. 3.

Referring to FIG. 5A, the frame 110 may be prepared. Here, A of FIG. 5A is a plan view of the frame 110, and B of FIG. 5A illustrates a cross section of a partial region that may be utilized as a unit package in A of FIG. 5A. The frame 110 may be manufactured and utilized at various sizes in order to facilitate mass production. That is, after the frame 110 having a large size is prepared, a plurality of electronic component packages 100A may be manufactured through a process to be described below. Then, the plurality of electronic component packages 100A may be singulated into individual unit packages through a sawing process. A fiducial mark for excellent pick-and-place (P&P) may be present in the frame 110. Since a position at which the electronic component 120 is mounted may be more clearly recognized through the fiducial mark, completeness of manufacturing may be improved.

Figure 5B:
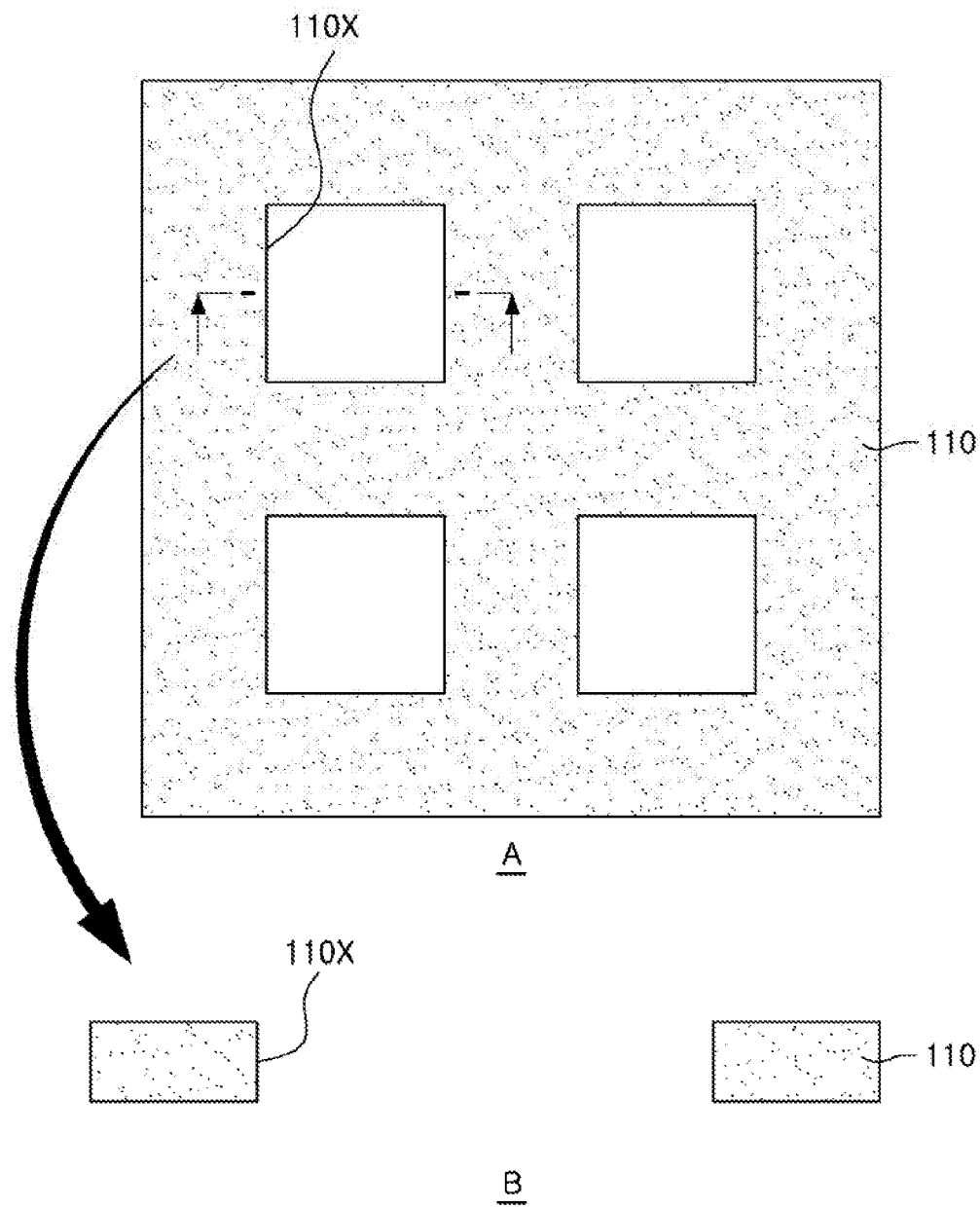

Referring to FIG. 5B, the through-holes 110X penetrating through the frame 110 may be formed. Here, A of FIG. 5B is a plan view of the frame 110 in which the through-holes 110X are formed, and B of FIG. 5B illustrates a cross section of a partial region that may be utilized as a unit package in A of FIG. 5B. A method of forming the through-hole 110X is not particularly limited, and may be performed by, for example, a mechanical drill and/or a laser drill, a sand blast method using polishing particles, a dry etching method using plasma, a wet etching method using an etchant, or the like. In a case in which the through-hole 110X is formed by etching, defects due to a foreign material may be fundamentally removed. A size, a shape, or the like, of the through-holes 110X may be designed depending on a size, a shape, the number, or the like, of electronic components 120 to be mounted.

Figure 5C:
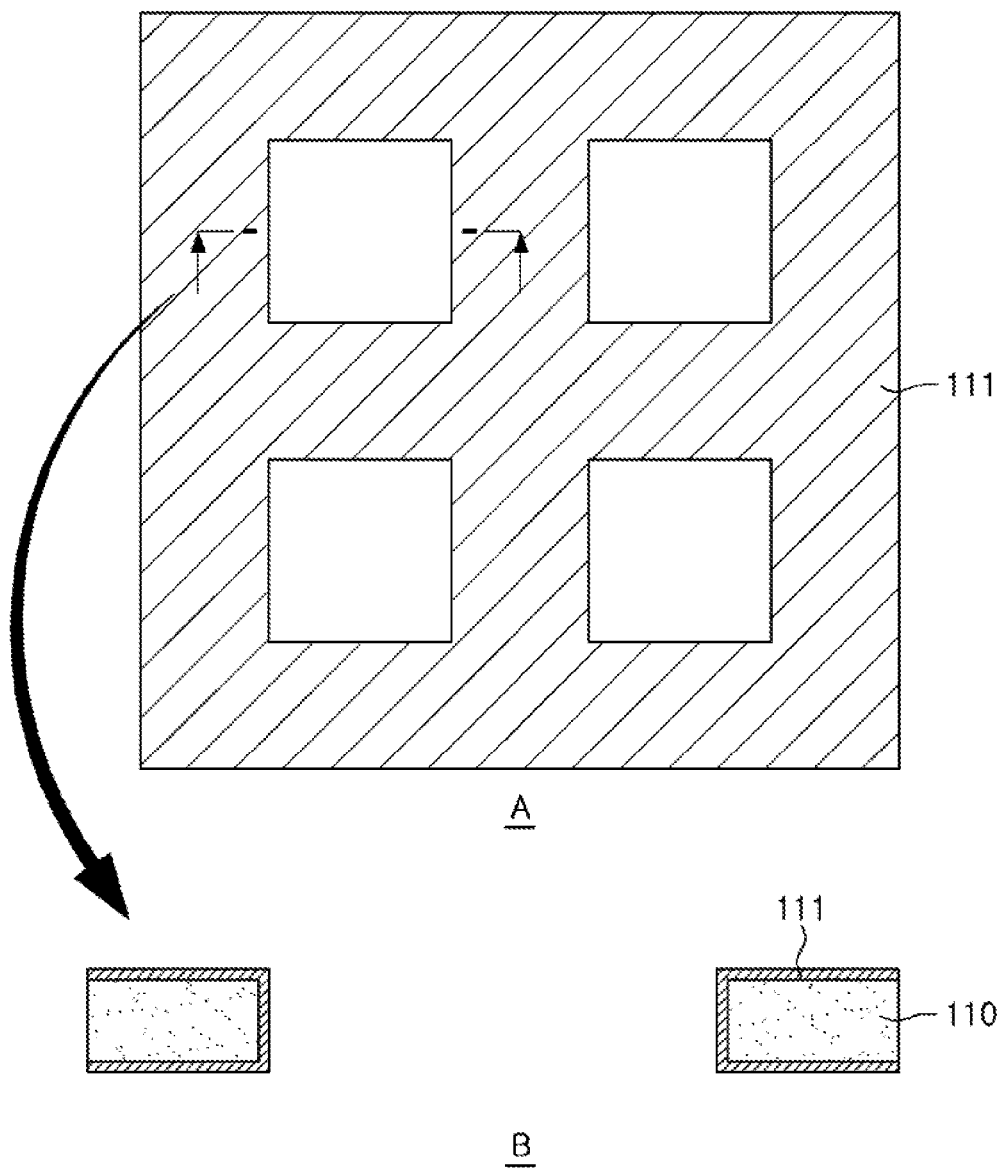

Referring to FIG. 5C, the bonding part 111 may be formed on the upper surface 110A and the lower surface 110B of the frame 110 and the inner wall of the through-hole 110X. Here, A of FIG. 5C is a plan view of the frame 110 in which the bonding part 111 is formed, and B of FIG. 5C illustrates a cross section of a partial region that may be utilized as a unit package in A of FIG. 5C. The bonding part 111 may be formed by a known method, such as electrolytic copper plating, electroless copper plating, or the like. In more detail, the bonding part 111 may be formed using a method such as chemical vapor deposition (CVD), physical vapor deposition (PVD), sputtering, a subtractive process, an additive process, a semi-additive process (SAP), a modified semi-additive process (MSAP), or the like, but is not limited thereto.

Figure 5D:
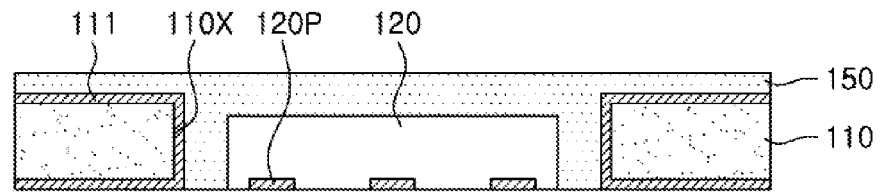

Referring to FIG. 5D, the electronic component 120 may be disposed in the through-holes 110X. The electronic component 120 may be disposed in a face-down form so that the electrode pads 120P are directed toward a lower portion. However, the electronic component 120 is not limited thereto, and may also be disposed in a face-up form, if necessary. Then, the electronic component 120 may be encapsulated using the insulating part 150. The insulating part 150 may cover at least upper portions of the frame 110 and the electronic component 120, and may be provided in the space within the through-hole 110X. The insulating part 150 may be formed by a known method. For example, the insulating part 150 may be formed by a method of laminating a precursor of the insulating part 150 and then hardening the precursor. Alternatively, the insulating part 150 may be formed by applying a material for forming the insulating part 150 and then hardening the material so as to encapsulate the electronic component 120 in a state in which a lower portion of the through-hole is closed by a tape (not illustrated), or the like. The electronic component 120 may be fixed by the hardening. As the method of laminating the precursor, for example, a method of performing a hot press process of pressing the precursor for a predetermined time at a high temperature, decompressing the precursor, and then cooling the precursor to a room temperature, cooling the precursor in a cold press process, and then separating a work tool, or the like, may be used. As the method of applying the material, for example, a screen printing method of applying ink with a squeegee, a spray printing method of applying ink in a mist form, or the like, may be used.

Figure 5E:
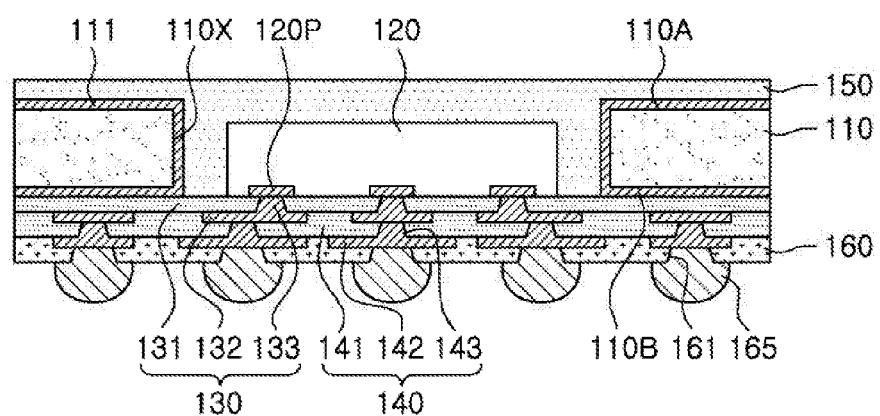

Referring to FIG. 5E, the redistribution parts 130 and 140 may be formed below the frame 110 and the electronic component 120. In detail, the insulating layer 131 may be formed beneath the frame 110 and the electronic component 120. Then, the conductive pattern 132 and the conductive vias 133 may be formed to form the redistribution part 130. Next, the insulating layer 141 may be formed beneath the insulating layer 131. Then, the conductive pattern 142 and the conductive vias 143 may be formed to form the redistribution part 140.

The insulating layers 131 and 141 may be formed by a known method, such as a method of laminating precursors of the insulating layers 131 and 141 and then hardening the precursors, a method of applying materials for forming the insulating layers 131 and 141 and then hardening the materials, or the like, but are not limited thereto. As the method of laminating the precursor, for example, a method of performing a hot press process of pressing the precursor for a predetermined time at a high temperature, decompressing the precursor, and then cooling the precursor to a room temperature, cooling the precursor in a cold press process, and then separating a work tool, or the like, may be used. As the method of applying the material, for example, a screen printing method of applying ink with a squeegee, a spray printing method of applying ink in a mist form, or the like, may be used. The hardening process, which is a post-process, may be a process of drying the material so as not to be completely hardened in order to use a photolithography method, or the like.

The conductive patterns 132 and 142 and the conductive vias 133 and 143 may be formed by the known method. First, via holes (not illustrated) may be formed using the mechanical drill and/or the laser drill described above. Alternatively, the via holes may also be formed by a photolithography method in a case in which the insulating layer 131 contains the PID resin, or the like. The conductive patterns 132 and 142 and the conductive vias 133 and 143 may also be formed by electrolytic copper plating, electroless copper plating, or the like, using a dry film pattern.

After the redistribution parts 130 and 140 are formed, the outer layer 160 may be formed below the redistribution parts 130 and 140. The outer layer 160 may also be formed by a method of laminating a precursor of the outer layer 160 and then hardening the precursor, a method of applying a material for forming the outer layer 160 and then hardening the material, or the like. Then, the first opening parts 161 may be formed in the outer layer 160 so as to expose at least portions of the conductive pattern 142. The first opening parts 161 may be formed using a mechanical drill and/or a laser drill. Alternatively, the first opening parts 161 may be formed by a photolithography method.

After the first opening parts 161 are formed in the outer layer 160, the first external connection terminals 165 disposed in the first opening parts 161 may be formed. A method of forming the first external connection terminals 165 is not particularly limited. That is, the first external connection terminals 165 may be formed by a method well-known in the related art depending on a structure or a form of the first external connection terminals 165. The first external connection terminals 165 may be fixed by reflow, and portions of the first external connection terminals 165 may be embedded in the outer layer 160 in order to enhance fixing force, and the remaining portions of the first external connection terminals 165 may be externally exposed, whereby reliability may be improved. In some cases, only the first opening parts 161 may be formed, and the first external connection terminals 165 may be formed, if necessary, by a separate process by a client purchasing the electronic component package 100A.

Figure 6:
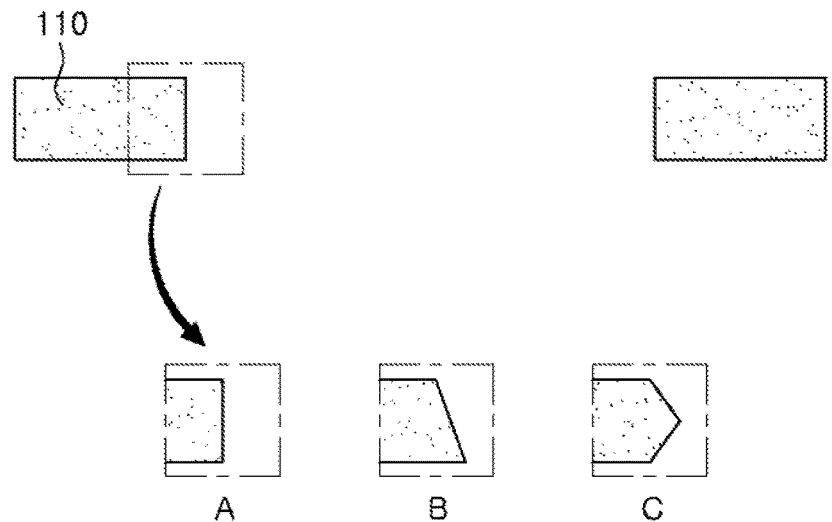
FIG. 6 is a view illustrating several cross sections of a frame of the electronic component package of FIG. 3.

FIG. 6 is a view illustrating various cross sections of the frame 110 in the electronic component package 100A according to an example. A cross section of the frame 110 may have a vertical shape as illustrated in A in a case in which the through-hole 110X is formed using a computer numerical control (CNC) drill, a punching method, or the like, may have a bevel shape as illustrated in B in a case in which the through-hole 110X is formed using a single-sided laser drill, an etching method, or the like, or may have a double-bevel shape as illustrated in C in a case in which the through-hole 110X is formed using a double-sided laser drill, an etching method, or the like, but is not limited thereto.

Figure 7:
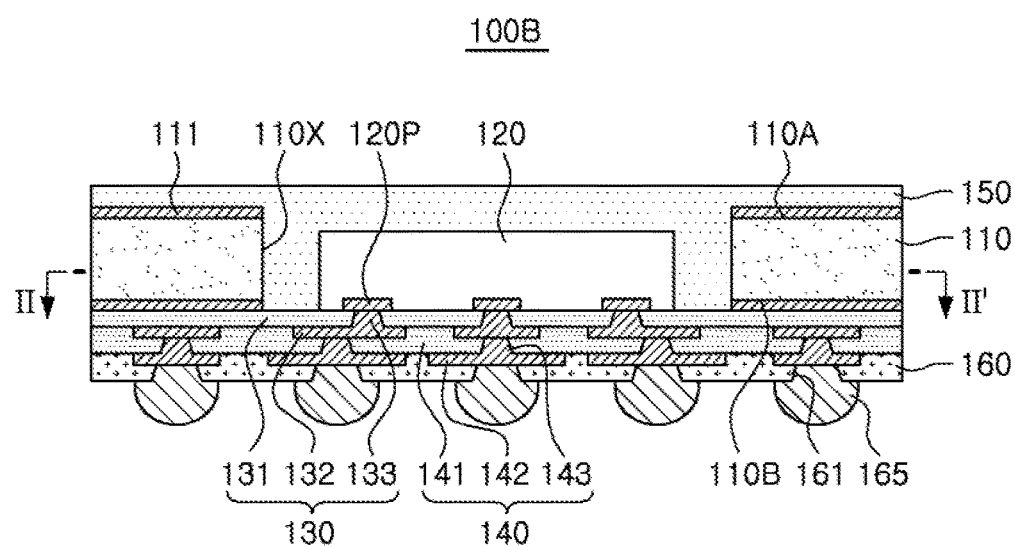
FIG. 7 is a cross-sectional view schematically illustrating another example of an electronic component package.
Figure 8:
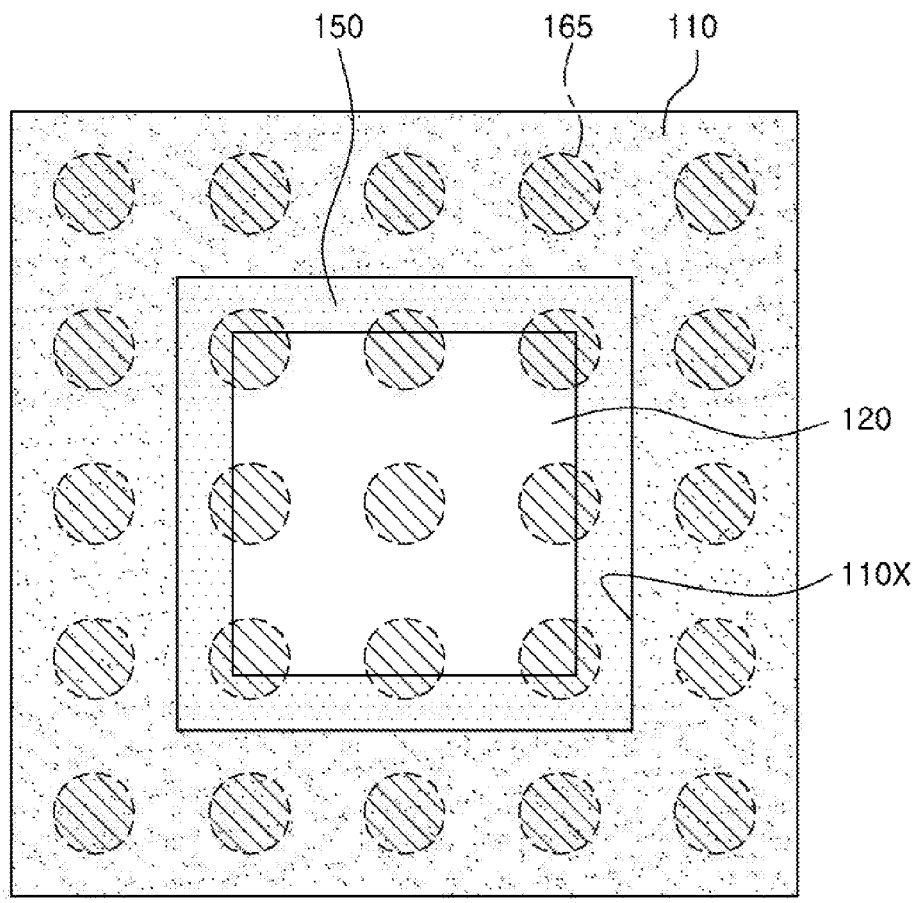
FIG. 8 is a schematic plan view of the electronic component package taken along line II-II' of FIG. 7.

FIG. 7 is a cross-sectional view schematically illustrating another example of an electronic component package. FIG. 8 is a schematic plan view of the electronic component package taken along line II-II' of FIG. 7. Referring to FIGS. 7 and 8, an electronic component package 100B according to another example may include a frame 110 having a through-hole 110X, an electronic component 120 disposed in the through-hole 110X, an insulating part 150 at least covering upper portions of the frame 110 and the electronic component 120, a bonding part 111 at least partially disposed between the frame 110 and the insulating part 150, and redistribution parts 130 and 140 disposed below the frame 110 and the electronic component 120, wherein the bonding part 111 may be formed on only an upper surface 110A and a lower surface 110B of the frame 110. That is, the bonding part 111 may not extend to and disposed on an inner wall of the through-hole 110X. Since respective components included in the electronic component package 100B according to another example are the same as the components described above, a description thereof will be omitted.

FIGS. 9A through 9D are schematic views illustrating examples of processes of manufacturing the electronic component package 100B according to another example. A description of contents overlapping the contents described above in a description for examples of processes of manufacturing the electronic component package 100B will be omitted, and contents different from the contents described above will be mainly described.

Figure 9A:
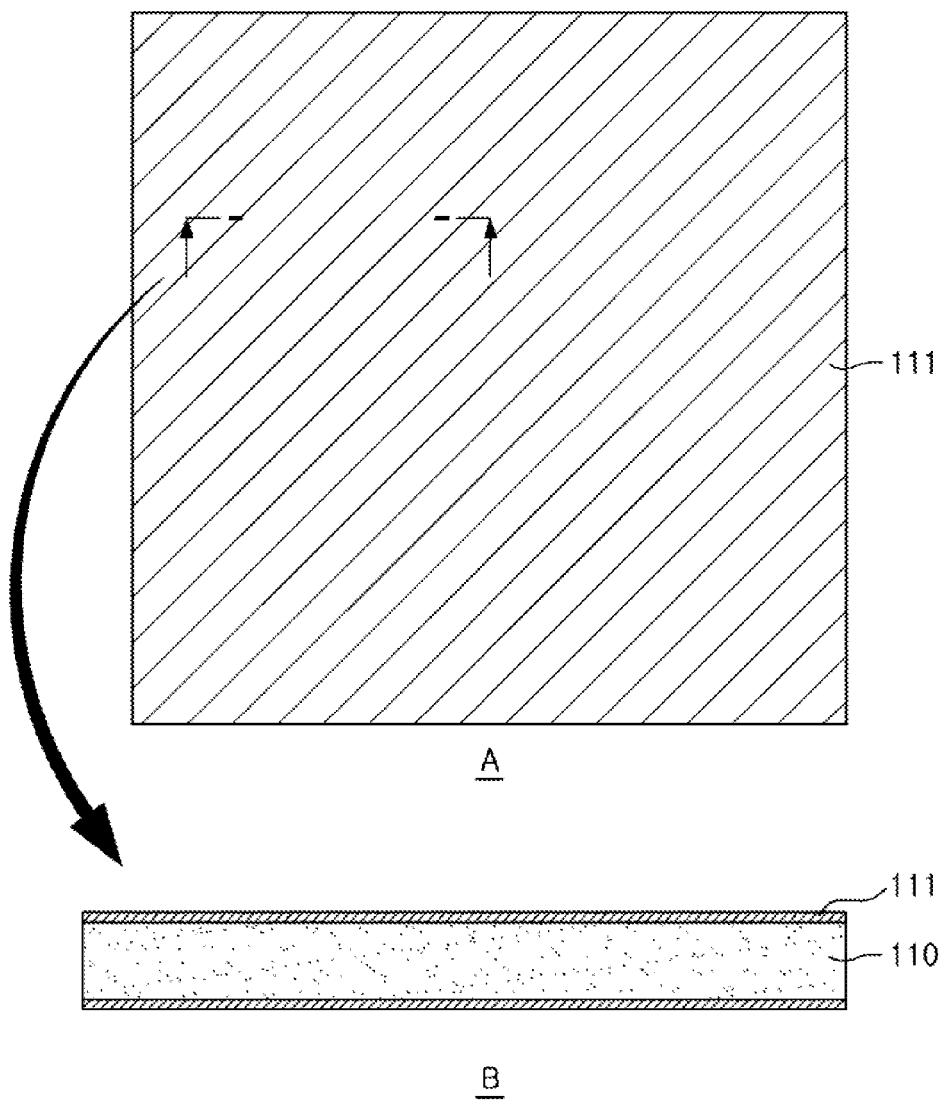
FIGS. 9A through 9D are schematic views illustrating examples of processes of manufacturing the electronic component package of FIG. 7.

Referring to FIG. 9A, the frame 110 having the bonding part 111 formed on the upper surface 110A and the lower surface 110B thereof may be prepared. Here, A of FIG. 9A is a plan view of the frame 110 in which the bonding part 111 is formed, and B of FIG. 9A illustrates a cross section of a partial region that may be utilized as a unit package in A of FIG. 9A. The bonding part 111 may be formed over the entire upper surface 110A and the entire lower surface 110B of the frame 110. Likewise, the frame 110 may be manufactured and utilized at various sizes in order to facilitate mass production.

Figure 9B:
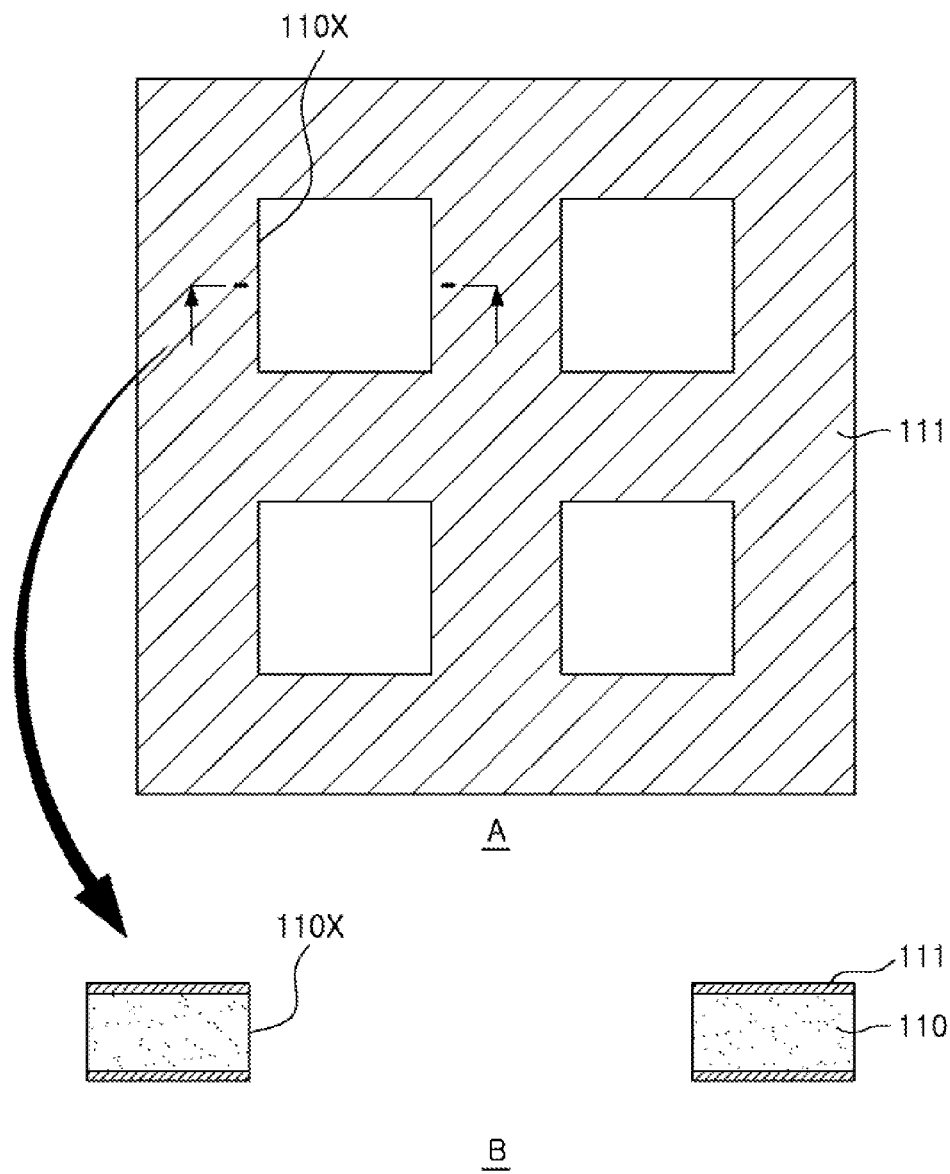

Referring to FIG. 9B, the through-holes 110X penetrating through the bonding part 111 and the frame 110 may be formed. Here, A of FIG. 9B is a plan view of the frame 110 in which the through-holes 110X are formed, and B of FIG. 9B illustrates a cross section of a partial region that may be utilized as a unit package in A of FIG. 9B. Likewise, the through-hole 110X may be formed by, for example, a mechanical drill and/or a laser drill, a sandblast method using polishing particles, a dry etching method using plasma, a wet etching method using an etchant, or the like. A size, a shape, or the like, of the through-holes 110X may be designed depending on a size, a shape, the number, or the like, of electronic components 120 to be mounted.

Figure 9C:
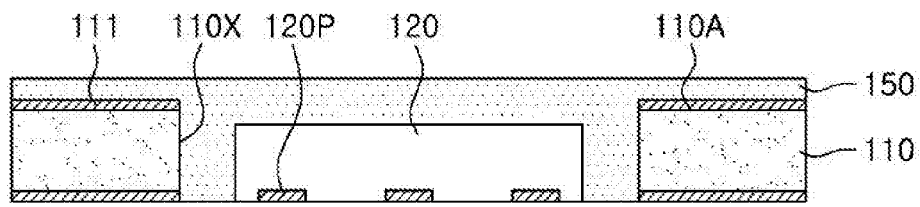

Referring to FIG. 9C, the electronic components 120 may be disposed in the through-holes 110X. Then, the electronic component 120 may be encapsulated using the insulating part 150. The insulating part 150 may cover at least upper portions of the frame 110 and the electronic component 120, and may be provided in the space within the through-hole 110X. The insulating part 150 may be formed by, for example, a method of laminating a precursor of the insulating part 150 and then hardening the precursor. Alternatively, the insulating part 150 may be formed by applying a material of the insulating part 150 and then hardening the material so as to encapsulate the electronic component 120 in a state in which a lower portion of the through-hole is closed by a tape (not illustrated), or the like.

Figure 9D:
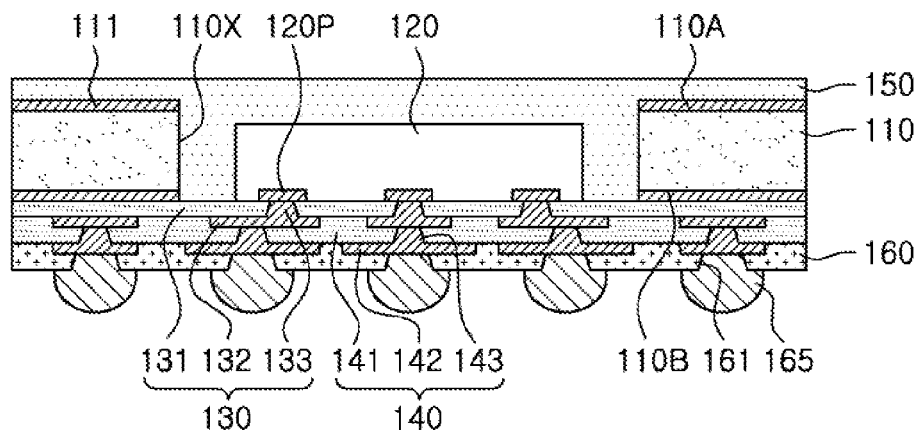

Referring to FIG. 9D, the redistribution parts 130 and 140 may be formed below the frame 110 and the electronic component 120. In detail, the insulating layer 131 may be formed beneath the frame 110 and the electronic component 120. Then, the conductive pattern 132 and the conductive vias 133 may be formed to form the redistribution part 130. Next, the insulating layer 141 may be formed beneath the insulating layer 131. Then, the conductive pattern 142 and the conductive vias 143 may be formed to form the redistribution part 140. After the redistribution parts 130 and 140 are formed, the outer layer 160 may be formed below the redistribution parts 130 and 140. Then, the first opening parts 161 may be formed in the outer layer 160 so as to expose at least portions of the conductive pattern 142. After the first opening parts 161 are formed in the outer layer 160, the first external connection terminals 165 disposed in the first opening parts 161 may be formed. In some cases, only the first opening parts 161 may be formed, and the first external connection terminals 165 may be formed, if necessary, by a separate process by a client purchasing the electronic component package 100B.

Figure 10:
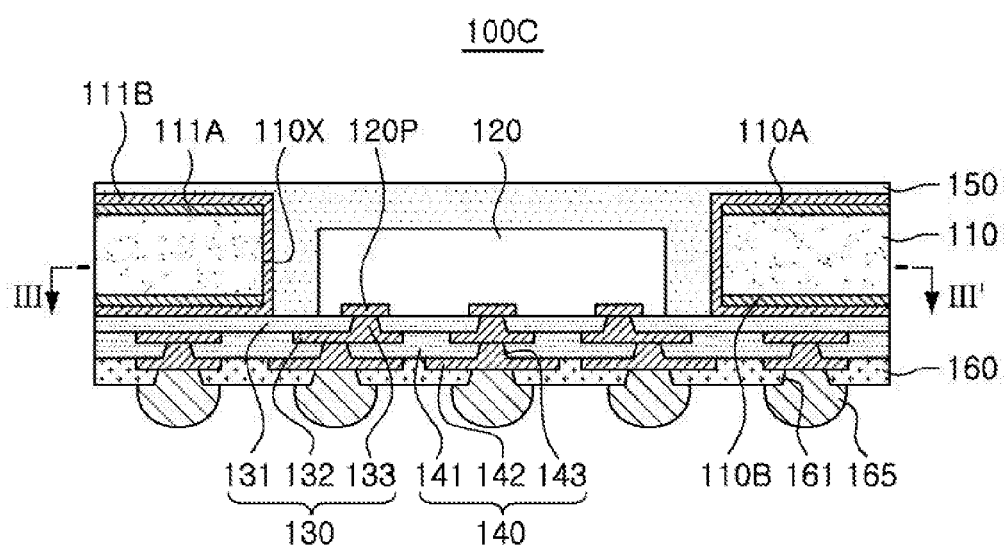
FIG. 10 is a cross-sectional view schematically illustrating another example of an electronic component package.
Figure 11:
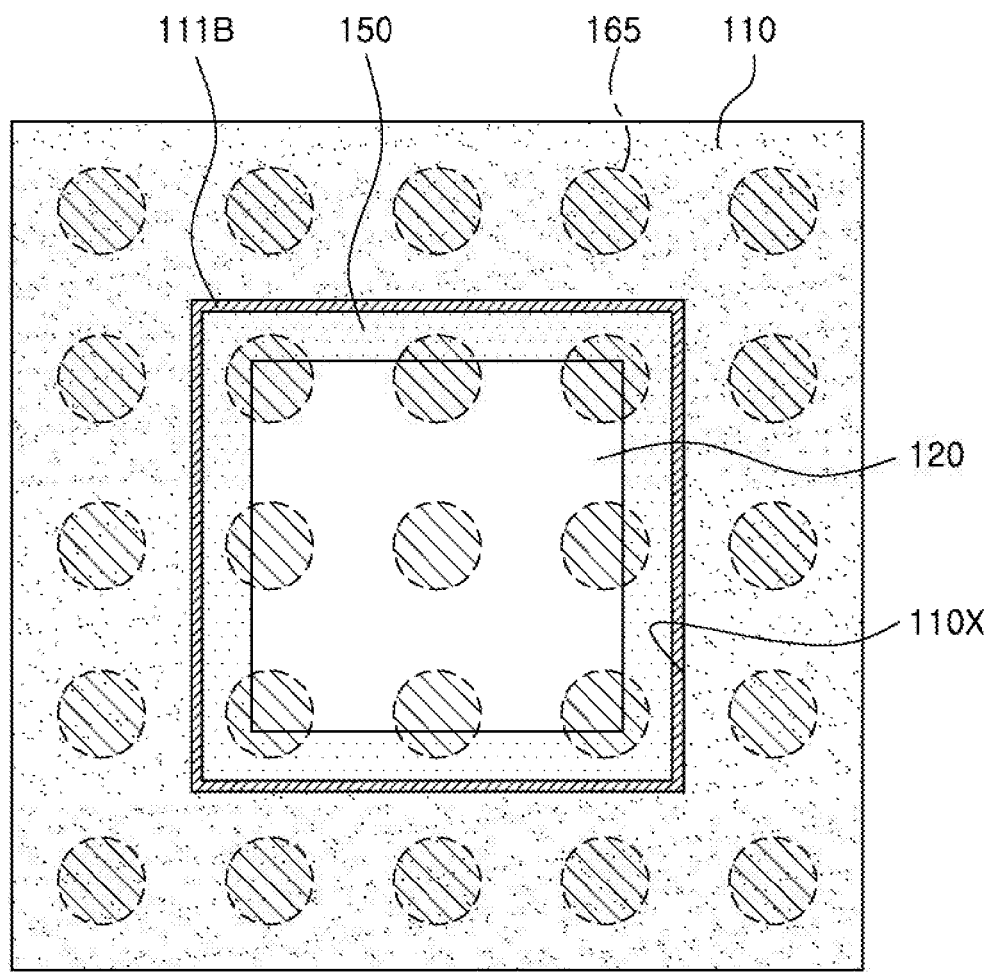
FIG. 11 is a schematic plan view of the electronic component package taken along line III-III' of FIG. 10.

FIG. 10 is a cross-sectional view schematically illustrating another example of an electronic component package. FIG. 11 is a schematic plan view of the electronic component package taken along line III-III' of FIG. 10. Referring to FIGS. 10 and 11, an electronic component package 100C according to another example may include a frame 110 having a through-hole 110X, an electronic component 120 disposed in the through-hole 110X, an insulating part 150 at least covering upper portions of the frame 110 and the electronic component 120, bonding parts 111A and 111B at least partially disposed between the frame 110 and the insulating part 150, and redistribution parts 130 and 140 disposed below the frame 110 and the electronic component 120. The bonding parts 111a and 111B may include a first bonding part 111A and a second bonding part 111B. The first bonding part 111A may be disposed on an upper surface 110A and a lower surface 110B of the frame 110, and the second bonding part 111B may be disposed on the first bonding part 111A and extend to an inner wall of the through-hole 110X. Since respective components included in the electronic component package 100C according to another example are the same as the components described above, a description thereof will be omitted.

FIGS. 12A through 12E are schematic views illustrating examples of processes of manufacturing the electronic component package 100C according to another example. A description of contents overlapping the contents described above in a description for examples of processes of manufacturing the electronic component package 100C will be omitted, and contents different from the contents described above will be mainly described.

Figure 12A:
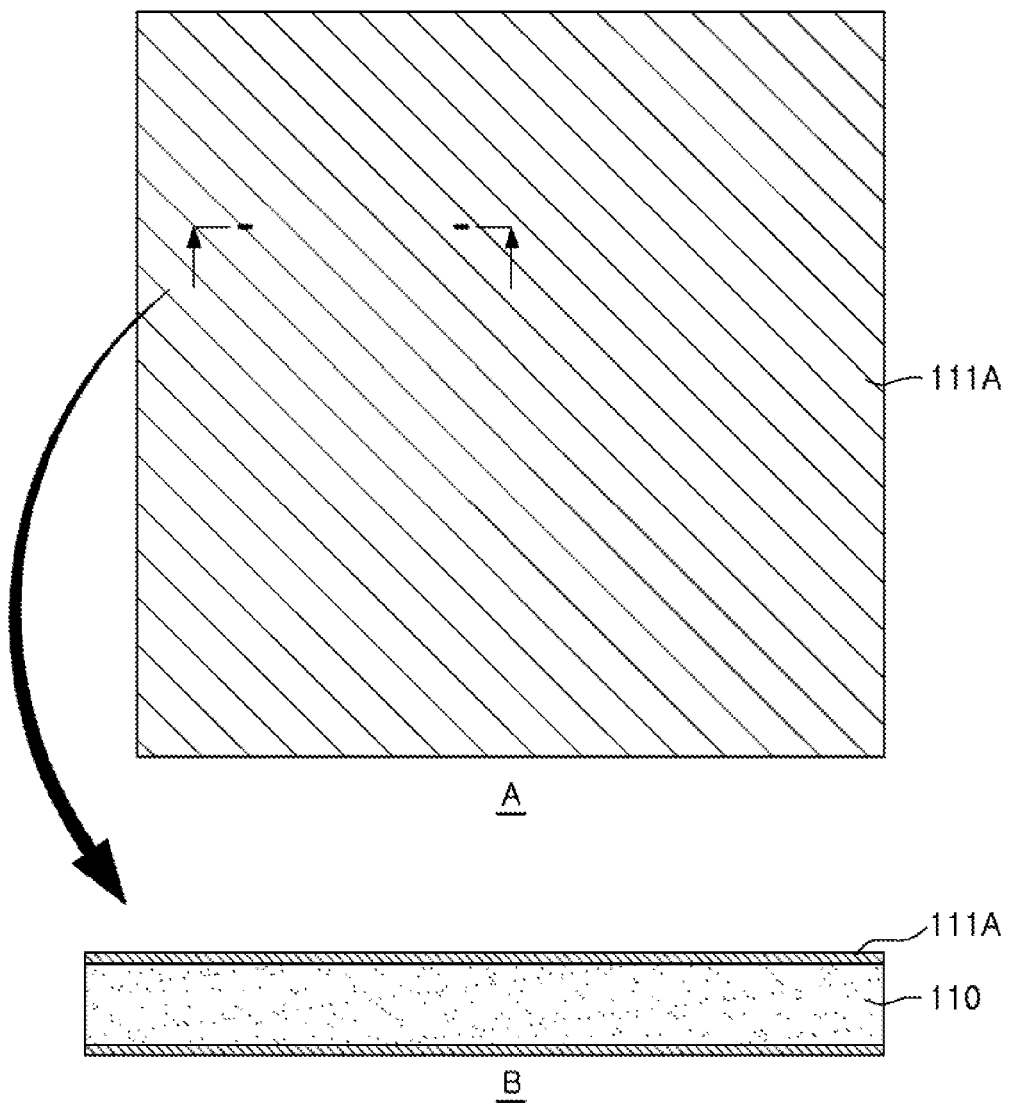
FIGS. 12A through 12E are schematic views illustrating examples of processes of manufacturing the electronic component package of FIG. 10.

Referring to FIG. 12A, the frame 110 having the first bonding part 111A formed on the upper surface 110A and the lower surface 110B thereof may be prepared. Here, A of FIG. 12A is a plan view of the frame 110 in which the first bonding part 111A is formed, and B of FIG. 12A illustrates a cross section of a partial region that may be utilized as a unit package in A of FIG. 12A. The first bonding part 111A may be formed over the entire upper surface 110A and the entire lower surface 110B of the frame 110. Likewise, the frame 110 may be manufactured and utilized at various sizes in order to facilitate mass production.

Figure 12B:
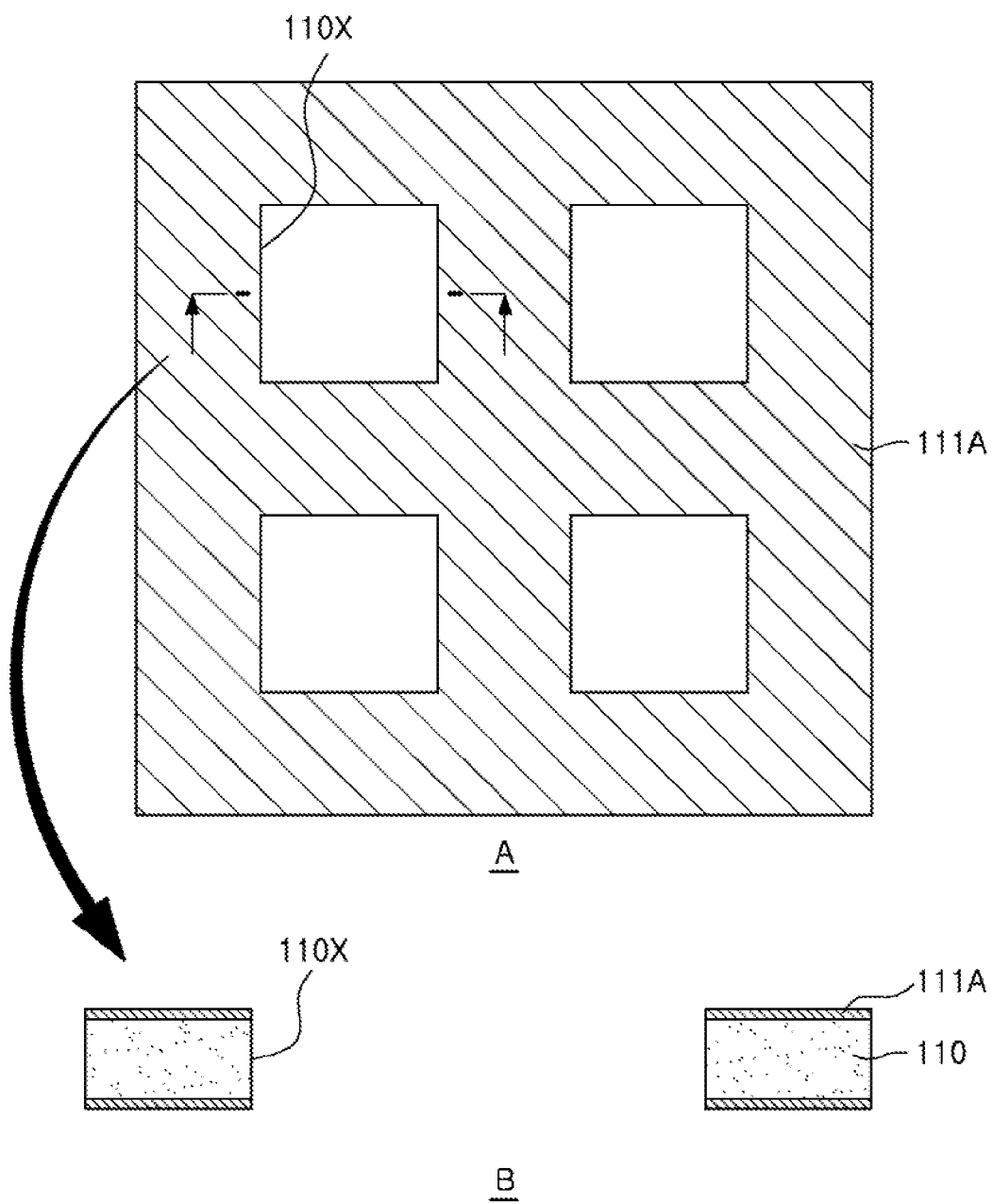

Referring to FIG. 12B, the through-holes 110X penetrating through the first bonding part 111A and the frame 110 may be formed. Here, A of FIG. 12B is a plan view of the frame 110 in which the through-holes 110X are formed, and B of FIG. 12B illustrates a cross section of a partial region that may be utilized as a unit package in A of FIG. 12B. Likewise, the through-hole 110X may be formed by, for example, a mechanical drill and/or a laser drill, a sand blast method using polishing particles, a dry etching method using plasma, a wet etching method using an etchant, or the like. A size, a shape, or the like, of the through-holes 110X may be designed depending on a size, a shape, the number, or the like, of electronic components 120 to be mounted.

Figure 12C:
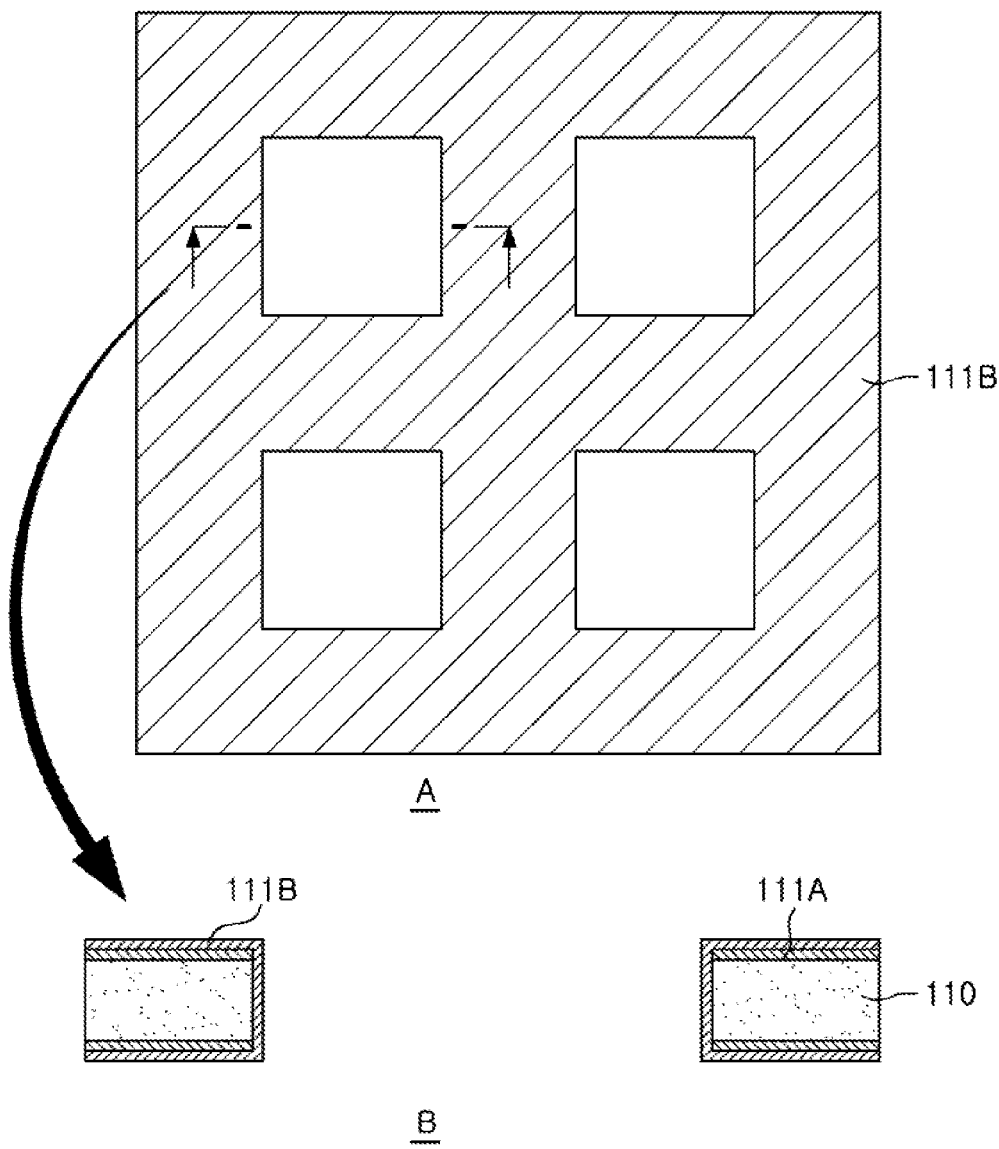

Referring to FIG. 12C, the second bonding part 111B may be formed on the first bonding part 111A and the inner wall of the through-hole 110X. As a result, two bonding parts 111A and 111B may be formed on the upper surface 110A and the lower surface 110B of the frame 110, and a single bonding part 111B may be disposed on the inner wall of the through-hole 110X. Here, A of FIG. 12C is a plan view of the frame 110 in which the second bonding part 111B is formed, and B of FIG. 12C illustrates a cross section of a partial region that may be utilized as a unit package in A of FIG. 12C. Thus, a thickness of the first and second bonding parts 111A and 111B formed on either the upper surface 110A or the lower surface 110B of the frame 110 may be greater than a thickness of the second bonding part 111B formed on the inner wall of the through-hole 110X of the frame 110. The second bonding part 111B may also be formed by a known method, such as electrolytic copper plating, electroless copper plating, or the like.

Figure 12D:
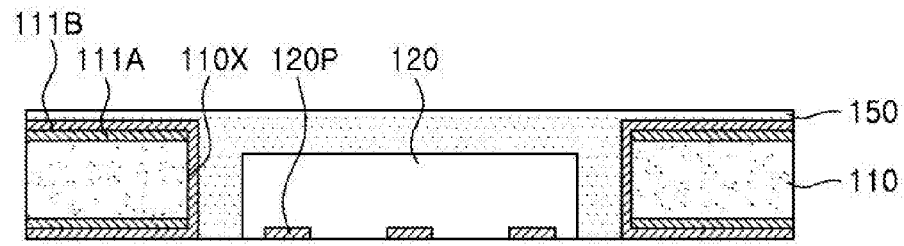

Referring to FIG. 12D, the electronic component 120 may be disposed in the through-holes 110X. Then, the electronic component 120 may be encapsulated using the insulating part 150. The insulating part 150 may cover at least upper portions of the frame 110 and the electronic component 120, and may be provided in the space within the through-hole 110X. The insulating part 150 may be formed by, for example, a method of laminating a precursor of the insulating part 150 and then hardening the precursor. Alternatively, the insulating part 150 may be formed by applying a material of the insulating part 150 and then hardening the material so as to encapsulate the electronic component 120 in a state in which a lower portion of the through-hole is closed by a tape (not illustrated), or the like.

Figure 12E:
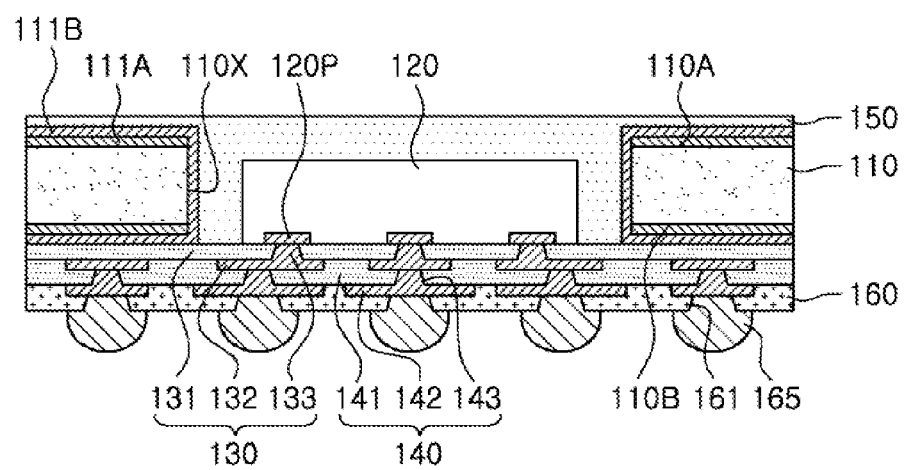

Referring to FIG. 12E, the redistribution parts 130 and 140 may be formed below the frame 110 and the electronic component 120. In detail, the insulating layer 131 may be formed beneath the frame 110 and the electronic component 120. Then, the conductive pattern 132 and the conductive vias 133 may be formed to form the redistribution part 130. Next, the insulating layer 141 may be formed beneath the insulating layer 131. Then, the conductive pattern 142 and the conductive vias 143 may be formed to form the redistribution part 140. After the redistribution parts 130 and 140 are formed, the outer layer 160 may be formed below the redistribution parts 130 and 140. Then, the first opening parts 161 may be formed in the outer layer 160 so as to expose at least portions of the conductive pattern 142. After the first opening parts 161 are formed in the outer layer 160, the first external connection terminals 165 disposed in the first opening parts 161 may be formed. In some cases, only the first opening parts 161 may be formed, and the first external connection terminals 165 may be formed, if necessary, by a separate process by a client purchasing the electronic component package 100C.

Figure 13:
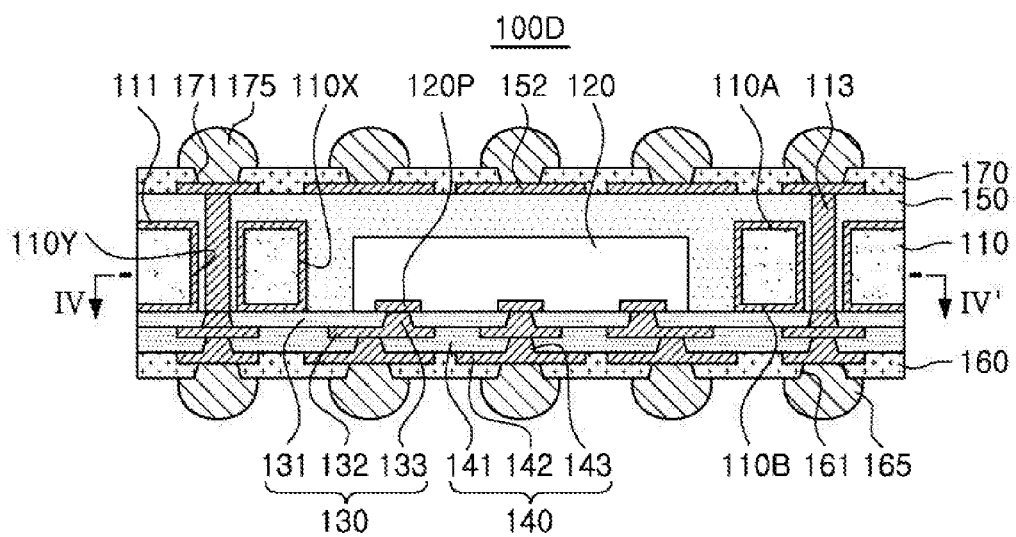
FIG. 13 is a cross-sectional view schematically illustrating another example of an electronic component package.
Figure 14:
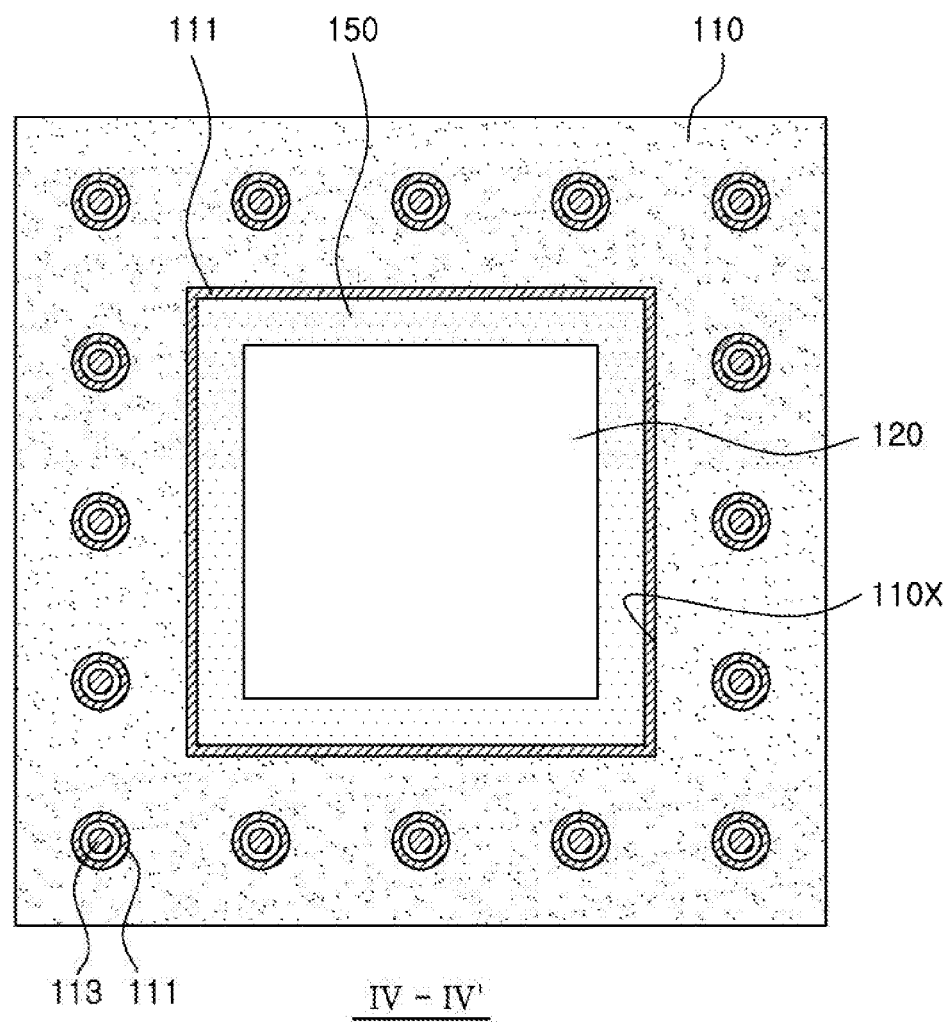
FIG. 14 is a schematic plan view of the electronic component package taken along line IV-IV' of FIG. 13.

FIG. 13 is a cross-sectional view schematically illustrating another example of an electronic component package. FIG. 14 is a schematic plan view of the electronic component package taken along line IV-IV' of FIG. 13. Referring to FIGS. 13 and 14, an electronic component package 100D according to another example may include a frame 110 having a through-hole 110X, an electronic component 120 disposed in the through-hole 110X, an insulating part 150 at least covering upper portions of the frame 110 and the electronic component 120, a bonding part 111 at least partially disposed between the frame 110 and the insulating part 150, through-wirings 113 penetrating through the frame 110, and redistribution parts 130 and 140 disposed below the frame 110 and the electronic component 120. An insulating material may be disposed between the frame 110 and/or the bonding part 111 and the through-wirings 113.

The through-wirings 113 penetrating through the upper surface 110A and the lower surface 110B of the frame 110 may serve to electrically connect conductive patterns disposed in different layers to each other, and a conductive material such as copper (Cu), aluminum (Al), silver (Ag), tin (Sn), gold (Au), nickel (Ni), lead (Pd), or alloys thereof, may be used as a material of the through-wirings 113. The number, an interval, a disposition form, and the like, of through-wirings 113 are not particularly limited, and may be sufficiently modified depending on design particulars by those skilled in the art. The insulating material is disposed between the through-wirings 113 and the frame 110 and/or the bonding part 111 in order to electrically insulate the through-wirings 113 from the frame 110 and/or the bonding part 111. Here, the insulating material may be the same material as that of the insulating part 150 as illustrated in FIGS. 13 and 14 or may be an additionally disposed insulating material different from that of the insulating part 150.

The electronic component package 100D according to another example may further include an outer conductive pattern 152 disposed on the insulating part 150. The outer conductive pattern 152 disposed on the insulating part 150 may also serve as a redistribution pattern and/or a pad pattern, and a conductive material such as copper (Cu), aluminum (Al), silver (Ag), tin (Sn), gold (Au), nickel (Ni), lead (Pd), or alloys thereof, may be used as a material of the outer conductive pattern 152. A detailed example has been described above. The outer conductive pattern 152 may perform various functions depending on a design of the corresponding layer. For example, the outer conductive pattern 152 may serve as a ground (GND) pattern, a power (PWR) pattern, a signal (S) pattern, and the like, as redistribution patterns. Here, the signal (S) pattern may include various signals except for the ground (GND) pattern, the power (PWR) pattern, and the like, such as data signals, and the like. In addition, the outer conductive pattern 152 may serve as a via pad, an external connection terminal pad, or the like, as a pad pattern. Since the outer conductive pattern 152 may be disposed over an entire surface of the insulating part 150 and second external connection terminals 175 may also be disposed over an entire surface of a cover layer 170 to be described below, various designs may be possible. A thickness of the outer conductive pattern 152 is also not particularly limited, and may be, for example, about 10 µm to 50 µm. A surface treatment layer may be formed on exposed portions of the outer conductive pattern 152, if necessary. The surface treatment layer may be formed by, for example, electrolytic gold plating, electroless gold plating, OSP or electroless tin plating, electroless silver plating, electroless nickel plating/substituted gold plating, DIG plating, HASL, or the like.

The electronic component package 100D according to another example may further include the cover layer 170 disposed above the insulating part 150. The purpose of the cover layer 170 may be to protect the insulating part 150, the outer conductive pattern 152, or the like, from external physical or chemical damage, or the like. The cover layer 170 may have second opening parts 171 exposing at least portions of the outer conductive pattern 152 disposed on the insulating part 150. Although the second opening parts 171 may expose portions of an upper surface of the outer conductive pattern 152, the second opening parts 171 may also expose side surfaces of the outer conductive pattern 152 in some cases. A material of the cover layer 170 is not particularly limited. For example, a solder resist may be used as a material of the cover layer 170. In addition, various PID resins may be used as a material of the cover layer 170. The cover layer 170 may also be formed of multiple layers, if necessary.

The electronic component package 100D according to another example may further include second external connection terminals 175 disposed in the second opening parts 171 of the cover layer 170. The second external connection terminals 175 may be disposed in the second opening parts 171, and may be connected to the outer conductive pattern 152 exposed through the second opening part 171. The second external connection terminal 175 may be formed of a conductive material, such as copper (Cu), aluminum (Al), silver (Ag), tin (Sn), gold (Au), nickel (Ni), lead (Pd), solder, or the like, but is not particularly limited thereto. The second external connection terminal 175 may be a land, a ball, a pin, or the like. The second external connection terminal 175 may be formed of multiple layers or a single layer. In a case in which the second external connection terminal 175 is formed of multiple layers, the second external connection terminal 175 may contain a copper pillar and a solder, and in a case in which the second external connection terminal 175 is formed of a single layer, the second external connection terminal 175 may contain a tin-silver solder or copper. However, this is only an example, and the second external connection terminal 175 is not limited thereto. Since other respective components included in the electronic component package 100D according to another example are the same as the components described above, a description thereof will be omitted.

FIGS. 15A through 15F are schematic views illustrating examples of processes of manufacturing the electronic component package 100D according to an example. A description of contents overlapping the contents described above in a description for examples of processes of manufacturing the electronic component package 100D will be omitted, and contents different from the contents described above will be mainly described.

Figure 15A:
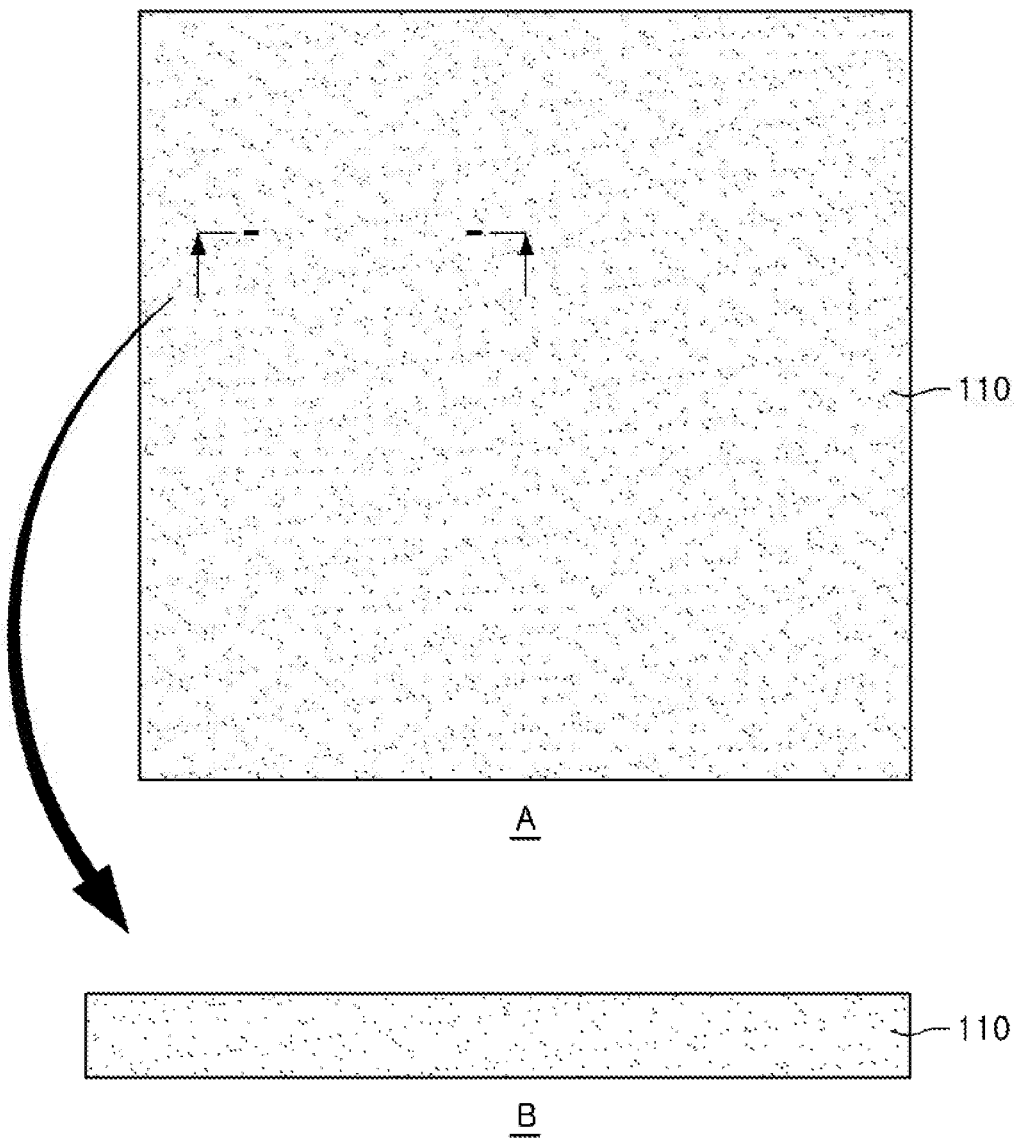
FIGS. 15A through 15F are schematic views illustrating examples of processes of manufacturing the electronic component package of FIG. 13.

Referring to FIG. 15A, the frame 110 may be prepared. Here, A of FIG. 15A is a plan view of the frame 110, and B of FIG. 15A illustrates a cross section of a partial region that may be utilized as a unit package in A of FIG. 15A. Likewise, the frame 110 may be manufactured and utilized at various sizes in order to facilitate mass production. In addition, a fiducial mark for excellent pick-and-place (P&P) may be present in the frame 110.

Figure 15B:
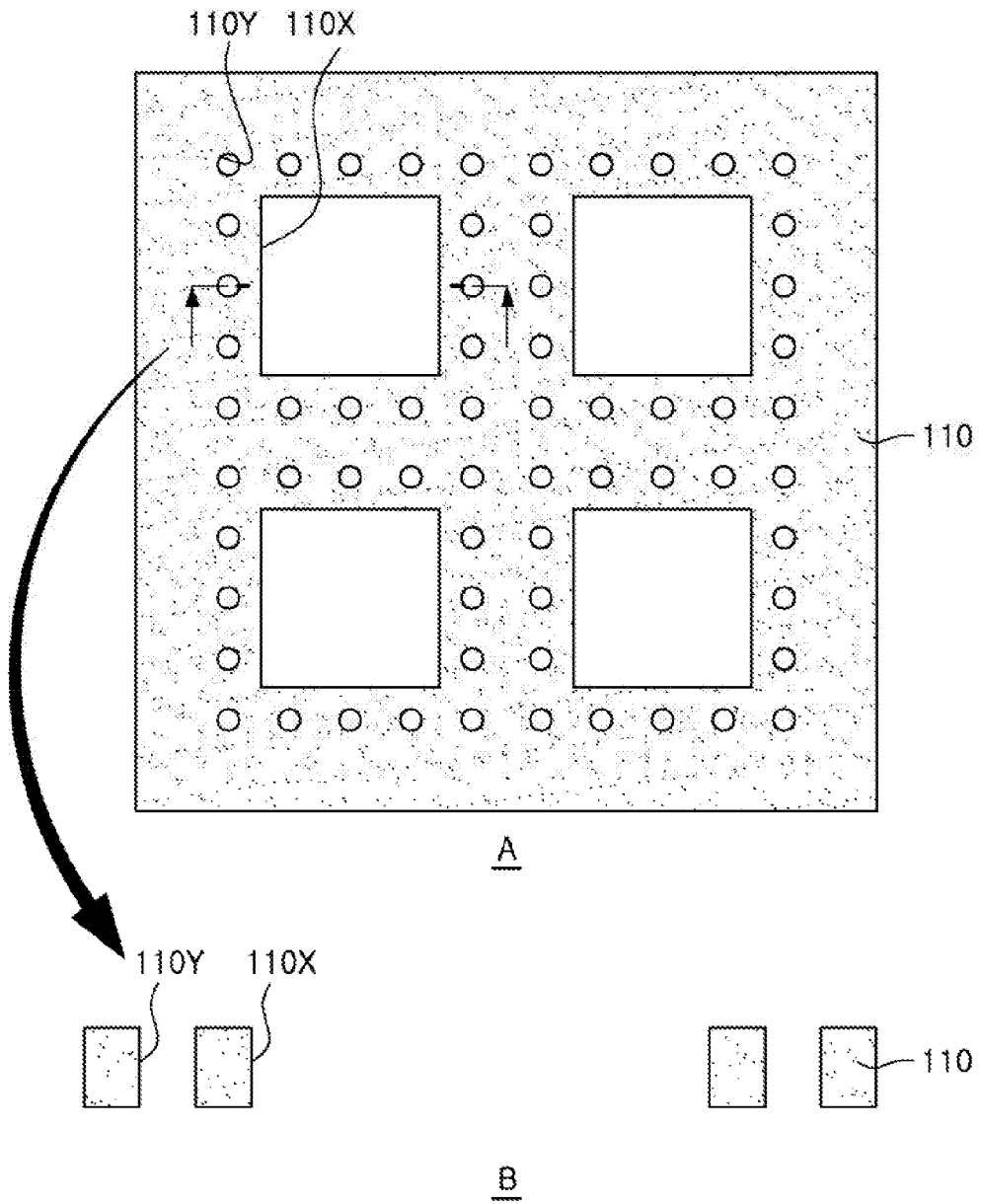

Referring to FIG. 15B, the through-holes 110X and the through-holes 110Y penetrating through the frame 110 may be formed. Here, A of FIG. 15B is a plan view of the frame 110 in which the through-holes 110X and the through-holes 110Y are formed, and B of FIG. 15B illustrates a cross section of a partial region that may be utilized as a unit package in A of FIG. 15B. A method of forming the through-hole 110X and the through-hole 110Y is not particularly limited, and may be performed by, for example, a mechanical drill and/or a laser drill, a sand blast method using polishing particles, a dry etching method using plasma, a wet etching method using an etchant, or the like. A size, a shape, or the like, of the through-holes 110X may be designed depending on a size, a shape, the number, or the like, of electronic components 120 to be mounted. A size, a shape, or the like, of the through-holes 110Y may be designed depending on a size, a shape, the number, or the like, of target through-wiring 113 to be formed.

Figure 15C:
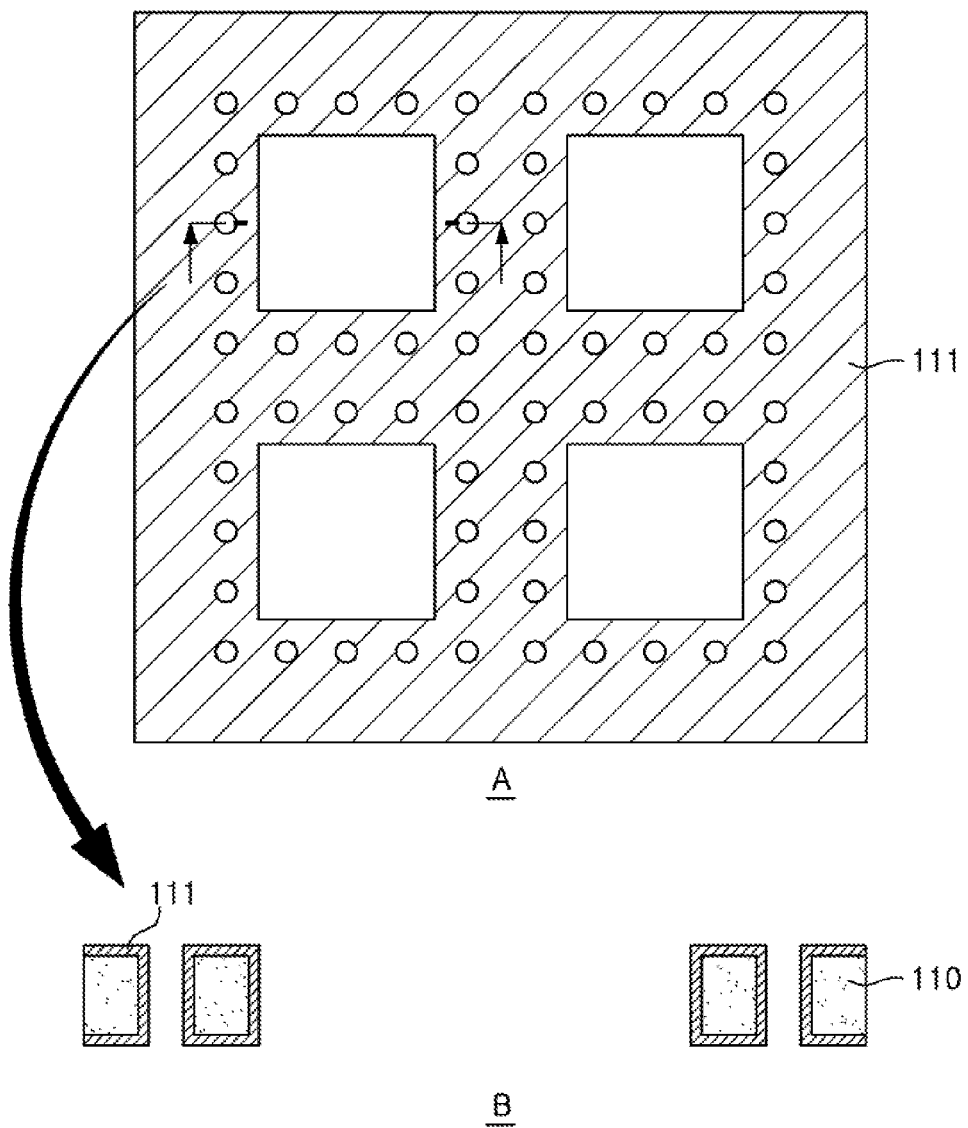

Referring to FIG. 15C, the bonding part 111 may be formed on the upper surface 110A and the lower surface 110B of the frame 110 and the inner walls of the through-hole 110X and the through-hole 110Y. Here, A of FIG. 15C is a plan view of the frame 110 in which the bonding part 111 is formed, and B of FIG. 15C illustrates a cross section of a partial region that may be utilized as a unit package in A of FIG. 15C. Likewise, the bonding part 111 may be formed by a known method, such as electrolytic copper plating, electroless copper plating, or the like.

Figure 15D:
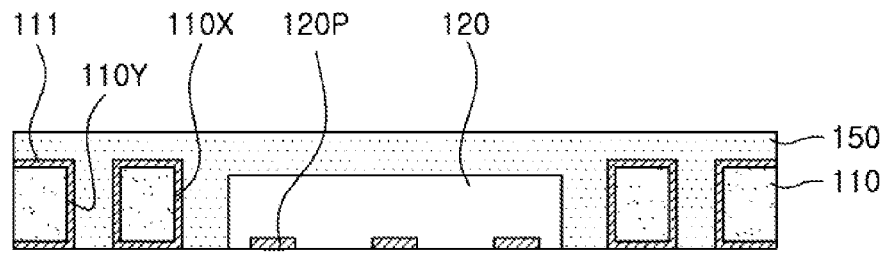

Referring to FIG. 15D, the electronic components 120 may be disposed in the through-holes 110X. Then, the electronic component 120 may be encapsulated using the insulating part 150. The insulating part 150 may cover at least upper portions of the frame 110 and the electronic component 120, and may be provided in the spaces within the through-hole 110X and the through-hole 110Y. The insulating part 150 may be formed by a known method. For example, the insulating part 150 may be formed by a method of laminating a precursor of the insulating part 150 and then hardening the precursor. Alternatively, the insulating part 150 may be formed by applying a material of the insulating part 150 and then hardening the material so as to encapsulate the electronic component 120 in a state in which a lower portion of the through-hole is closed by a tape (not illustrated), or the like.

Figure 15E:
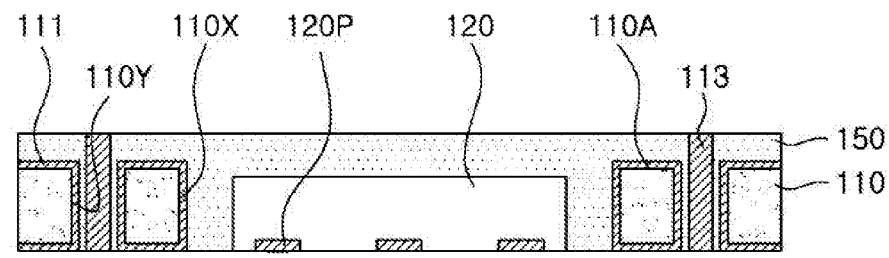

Referring to FIG. 15E, the through-wirings 113 may be formed in the through-holes 110Y. In detail, the through-wire 113 may be formed by forming a through-hole (not illustrated) having a diameter smaller than that of the through-hole 110Y in the through-hole 110Y and then filling the through-hole (not illustrated) with a conductive material. The through-wiring 113 may be formed by a known method, such as electrolytic copper plating, electroless copper plating, or the like. In more detail, the through-wiring 113 may be formed using a method such as CVD, PVD, sputtering, a subtractive process, an additive process, an SAP, an MSAP, or the like, but is not limited thereto.

Figure 15F:
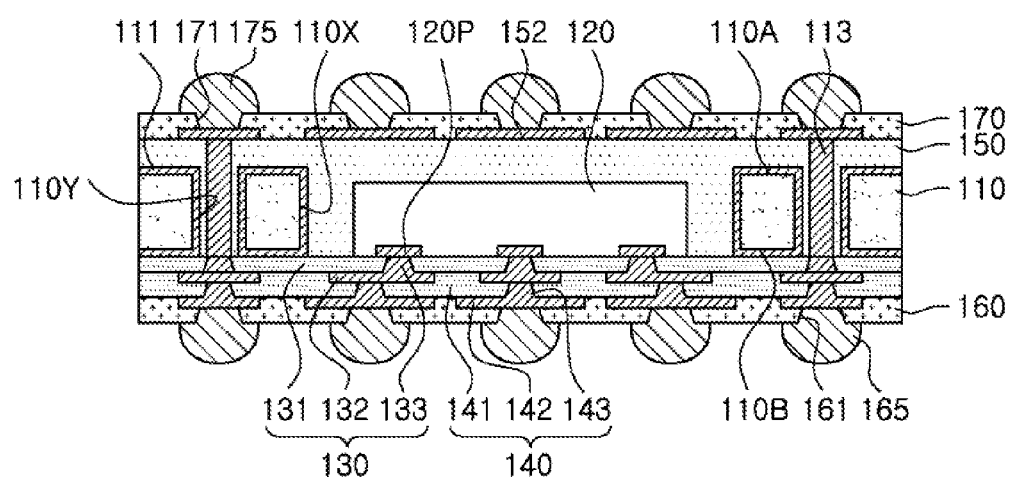

Referring to FIG. 15F, the redistribution parts 130 and 140 may be formed below the frame 110 and the electronic component 120. In detail, the insulating layer 131 may be formed beneath the frame 110 and the electronic component 120. Then, the conductive pattern 132 and the conductive vias 133 may be formed to form the redistribution part 130. Next, the insulating layer 141 may be formed beneath the insulating layer 131. Then, the conductive pattern 142 and the conductive vias 143 may be formed to form the redistribution part 140. After the redistribution parts 130 and 140 are formed, the outer layer 160 may be formed below the redistribution parts 130 and 140. Then, the first opening parts 161 may be formed in the outer layer 160 so as to expose at least portions of the conductive pattern 142. After the first opening parts 161 are formed in the outer layer 160, the first external connection terminals 165 disposed in the first opening parts 161 may be formed. In addition, the outer conductive pattern 152 may be formed on the insulating part 150. Then, the cover layer 170 may be formed above the insulating part 150. Then, the second opening parts 171 may be formed in the cover layer 170 so as to expose at least portions of the conductive pattern 142. After the second opening parts 171 are formed in the cover layer 170, the second external connection terminals 175 disposed in the second opening parts 171 may be formed. Since a method of forming the outer conductive pattern 152, the cover layer 170, the second opening parts 171, and the second external connection terminal 175 is substantially the same as a method of forming the conductive patterns 132 and 142, the outer layer 160, the first opening part 161, and the first external connection terminal 165, a description thereof will be omitted. In some cases, only the second external connection terminals 175 disposed in the second opening parts 171 of the cover layer 170 may be formed, only the first opening parts 161 may be formed in the outer layer 160, and the first external connection terminals 165 disposed in the first opening parts 161 may be formed, if necessary, by a separate process by a client purchasing the electronic component package 100D.

Meanwhile, unlike the example described above, the frame 110 having the bonding part 111 formed on the upper surface 110A and the lower surface 110B thereof may first be prepared, and the through-holes 110X and the through-holes 110Y may be formed in the frame 110, as described with reference to a method of manufacturing the electronic component package 100B according to another example. In this case, the manufactured electronic component package may have a form in which the bonding part 111 is not disposed on the inner walls of the through-hole 110X and the through-hole 110Y.

In addition, unlike the example described above, in a case in which the frame 110 having the first bonding part 111A formed on the upper surface 110A and the lower surface 110B thereof is first prepared, the through-holes 110X and the through-holes 110Y are formed in the frame 110, and the second bonding part 111B is again plated, as described with reference to a method of manufacturing the electronic component package 100C according to another example, the manufactured electronic component package may have a form in which the two bonding parts 111A and 111B are formed on the upper surface 110A and the lower surface 110B of the frame 110 and the single bonding part 111B is formed on the inner walls of the through-holes 110X and the through-holes 110Y.

Figure 16:
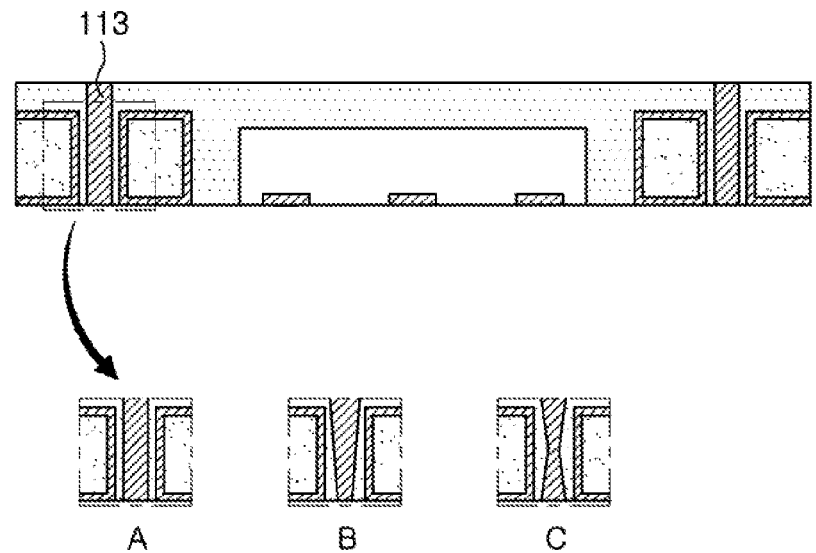
FIG. 16 is a view illustrating several cross sections of a through-wiring of the electronic component package of FIG. 13.

FIG. 16 is a view illustrating various cross sections of the through-wiring 113 in the electronic component package 100D according to an example. A cross section of the through-wiring 113 may have a vertical shape as illustrated in A in a case in which a small through-hole (not illustrated) is formed in the through-hole 110Y using a CNC drill, a punching method, or the like, may have a bevel shape as illustrated in B in a case in which a small through-hole (not illustrated) is formed in the through-hole 110Y using a single-sided laser drill, an etching method, or the like, or may have a double-bevel shape as illustrated in C in a case in which a small through-hole (not illustrated) is formed in the through-hole 110Y using a double-sided laser drill, an etching method, or the like, but is not limited thereto.

Figure 17:
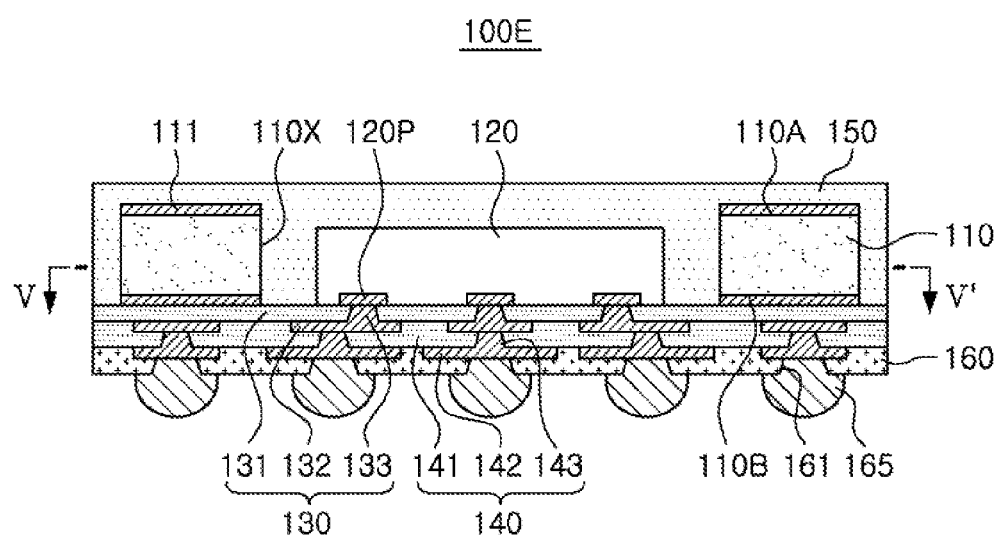
FIG. 17 is a cross-sectional view schematically illustrating another example of an electronic component package.
Figure 18:
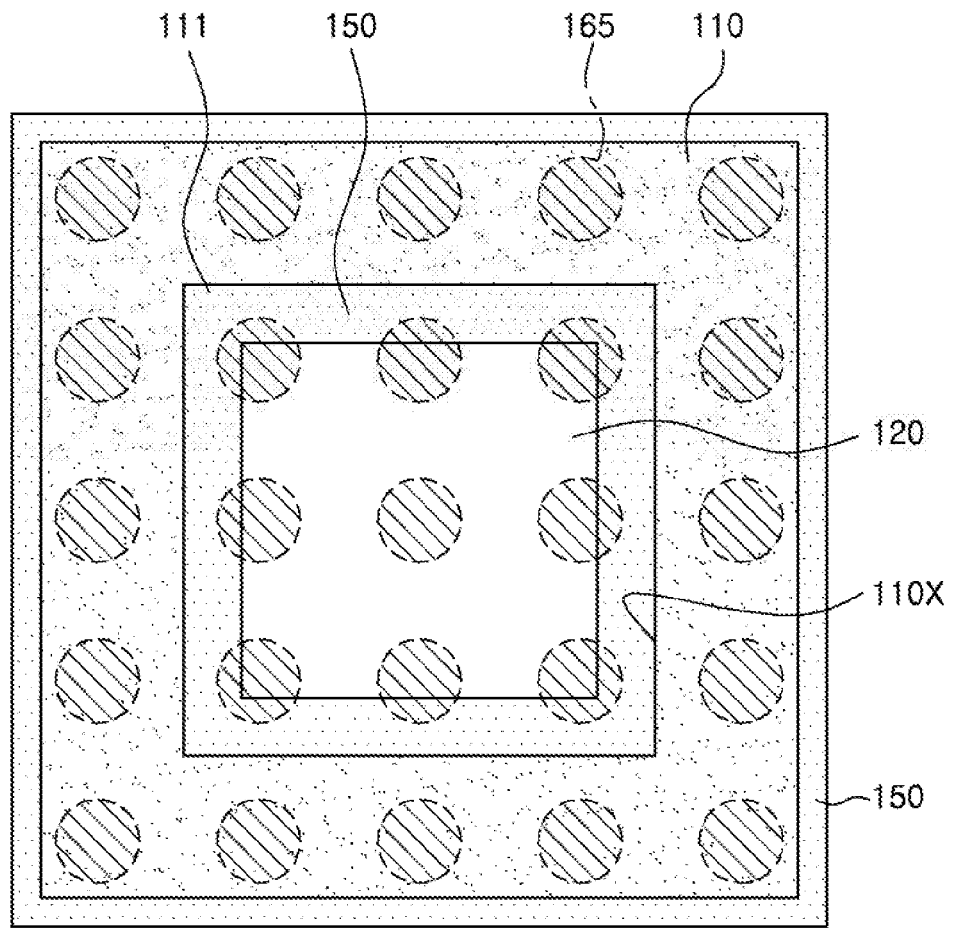
FIG. 18 is a schematic plan view of the electronic component package taken along line V-V' of FIG. 17.

FIG. 17 is a cross-sectional view schematically illustrating another example of an electronic component package. FIG. 18 is a schematic plan view of the electronic component package taken along line V-V' of FIG. 17. Referring to FIGS. 17 and 18, an electronic component package 100E according to another example may include a frame 110 having a through-hole 110X, an electronic component 120 disposed in the through-hole 110X, an insulating part 150 at least covering upper portions of the frame 110 and the electronic component 120, a bonding part 111 at least partially disposed between the frame 110 and the insulating part 150, and redistribution parts 130 and 140 disposed below the frame 110 and the electronic component 120. The insulating part 150 may enclose outer side portions of the frame 110. When the frame 110 is enclosed by the insulating part 150, as described above, the frame 110 may not be externally exposed. Therefore, improvement of reliability such as oxidation prevention, or the like, may be promoted. Since respective components included in the electronic component package 100E according to another example are the same as the components described above, a description thereof will be omitted.

FIGS. 19A through 19D are schematic views illustrating examples of processes of manufacturing the electronic component package 100E. A description of contents overlapping the contents described above in a description for examples of processes of manufacturing the electronic component package 100E will be omitted, and contents different from the contents described above will be mainly described.

Figure 19A:
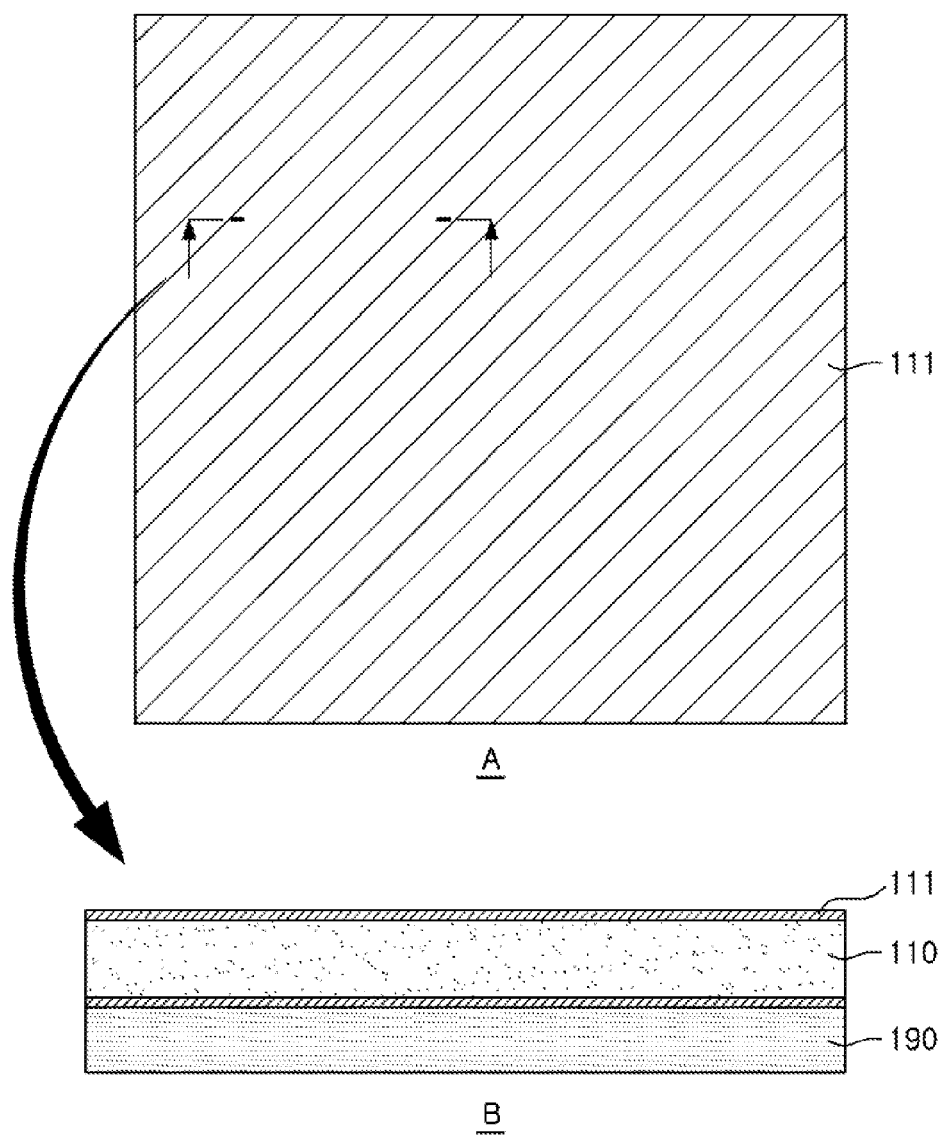
FIGS. 19A through 19D are schematic views illustrating examples of processes of manufacturing the electronic component package of FIG. 17.

Referring to FIG. 19A, the frame 110 having the bonding part 111 formed on the upper surface 110A and the lower surface 110B thereof may be prepared. In addition, an adhesive polymer layer 190 may be attached to the bonding part 111 disposed on the lower surface 110B of the frame 110. The bonding part 111 may be formed over the entire upper surface 110A and the entire lower surface 110B of the frame 110. Likewise, the frame 110 may be manufactured and utilized at various sizes in order to facilitate mass production.

Figure 19B:
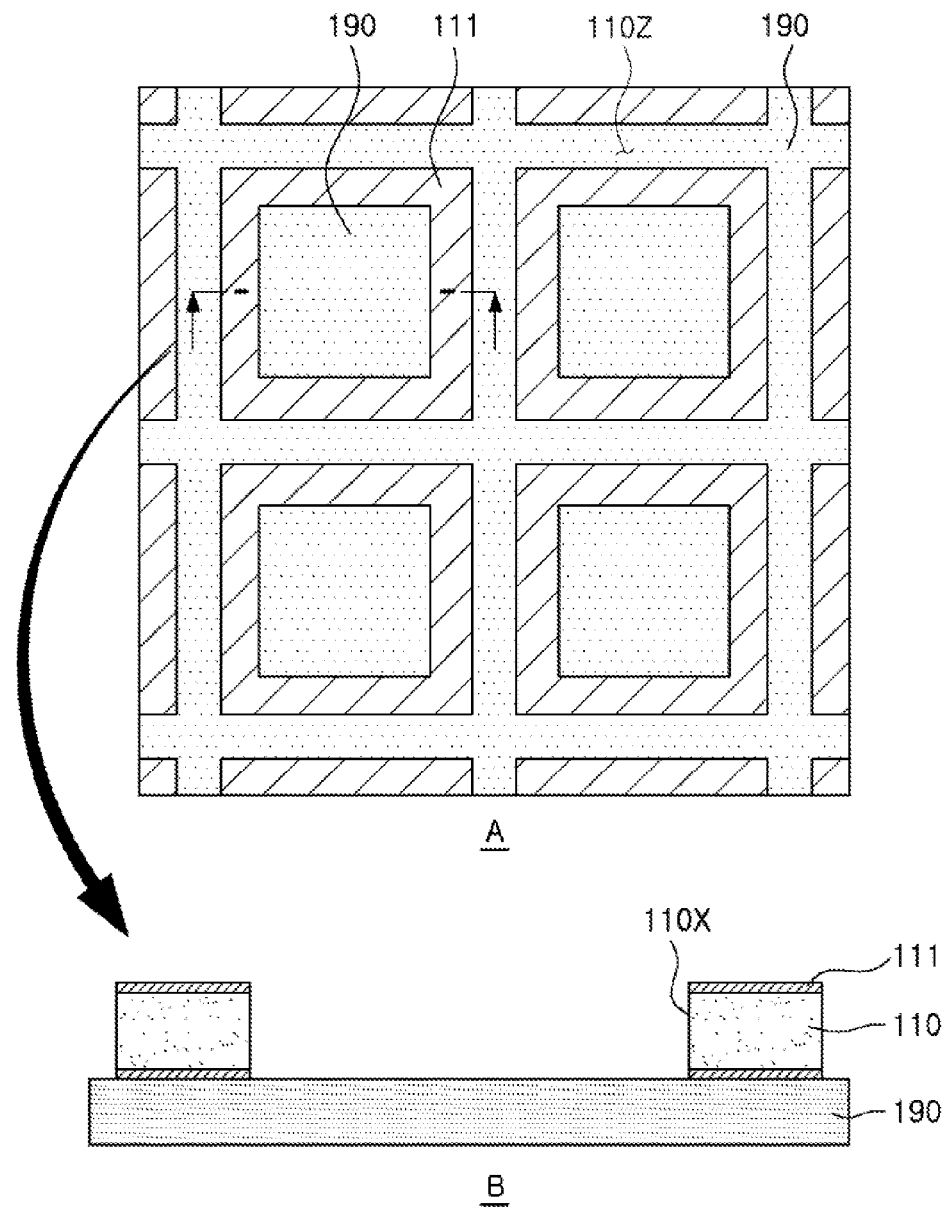

Referring to FIG. 19B, the through-holes 110X and dummy holes 1102 penetrating through the bonding part 111 and the frame 110 may be formed. The dummy hole 1102 may enclose the frame 110 having the through-hole 110X. A method of forming the through-hole 110X and the dummy hole 1102 is not particularly limited, and may be performed by, for example, a mechanical drill and/or a laser drill, a sand blast method using polishing particles, a dry etching method using plasma, a wet etching method using an etchant, or the like. A size, a shape, or the like, of the through-holes 110X and the dummy holes 1102 may be designed depending on a size, a shape, the number, or the like, of electronic components 120 to be mounted.

Figure 19C:
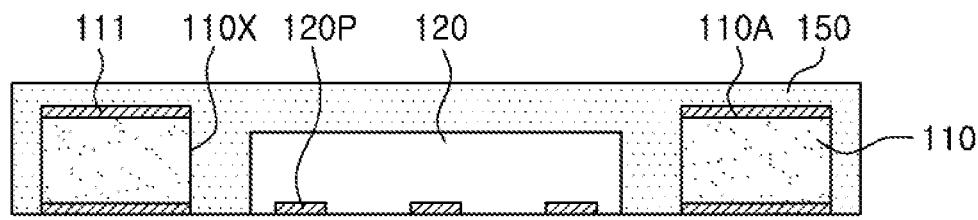

Referring to FIG. 19C, the electronic components 120 may be disposed in the through-holes 110X. Then, the electronic component 120 may be encapsulated using the insulating part 150. The adhesive polymer layer 190 may be peeled off. The insulating part 150 may cover at least upper portions of the frame 110 and the electronic component 120, and may be provided in the space within the through-hole 110X. In addition, the insulating part 150 may enclose the outer side portions of the frame 110 so that the frame 110 is not externally exposed. The insulating part 150 may be formed by, for example, a method of laminating a precursor of the insulating part 150 and then hardening the precursor. Alternatively, the insulating part 150 may be formed by a method of applying a material for forming the insulating part 150 and then hardening the material so as to encapsulate the electronic component 120.

Figure 19D:
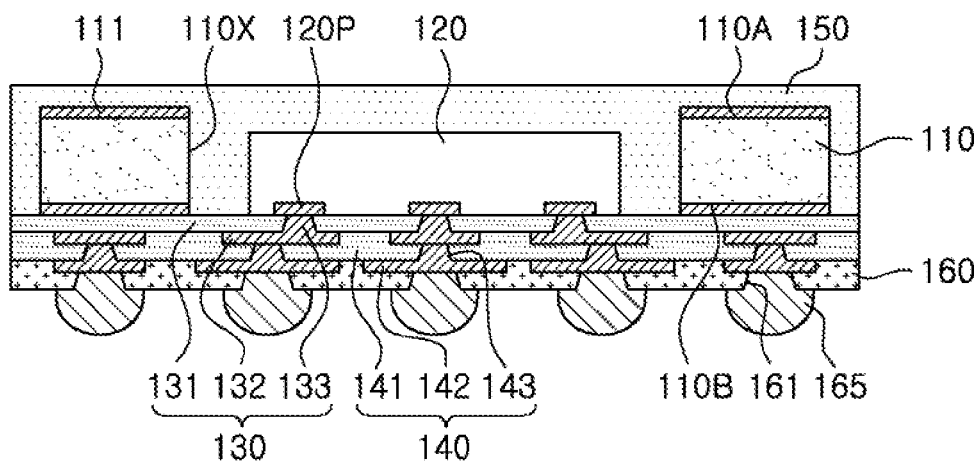

Referring to FIG. 19D, the redistribution parts 130 and 140 may be formed below the frame 110 and the electronic component 120. In detail, the insulating layer 131 may be formed beneath the frame 110 and the electronic component 120. Then, the conductive pattern 132 and the conductive vias 133 may be formed to form the redistribution part 130. Next, the insulating layer 141 may be formed beneath the insulating layer 131. Then, the conductive pattern 142 and the conductive vias 143 may be formed to form the redistribution part 140. After the redistribution parts 130 and 140 are formed, the outer layer 160 may be formed below the redistribution parts 130 and 140. Then, the first opening parts 161 may be formed in the outer layer 160 so as to expose at least portions of the conductive pattern 142. After the first opening parts 161 are formed in the outer layer 160, the first external connection terminals 165 disposed in the first opening parts 161 may be formed. In some cases, only the first opening parts 161 may be formed, and the first external connection terminals 165 may be formed, if necessary, by a separate process by a client purchasing the electronic component package 100E.

Meanwhile, unlike the example described above, in a case in which the through-holes 110X and the dummy holes 1102 are first formed in the frame 110, the bonding part 111 is plated, and the insulating part 150 is formed, as described with reference to a method of manufacturing the electronic component package 100A according to an example, and the manufactured electronic device package may have a form in which the bonding part 111 extends to and disposed on inner walls of the through-holes 110X and the dummy holes 1102.

In addition, unlike the example described above, in a case in which the through-holes 110X and the dummy holes 1102 are first formed in the frame 110 having the first bonding part 111A formed on the upper surface 110A and the lower surface 110B thereof, and the second bonding part 111B is again plated, as described with reference to a method of manufacturing the electronic component package 100C according to another example, the manufactured electronic component package may have a form in which the two bonding parts 111A and 111B are formed on the upper surface 110A and the lower surface 110B of the frame 110 and the single bonding part 111B is formed on the inner walls of the through-holes 110X and the dummy holes 1102.

Figure 21:
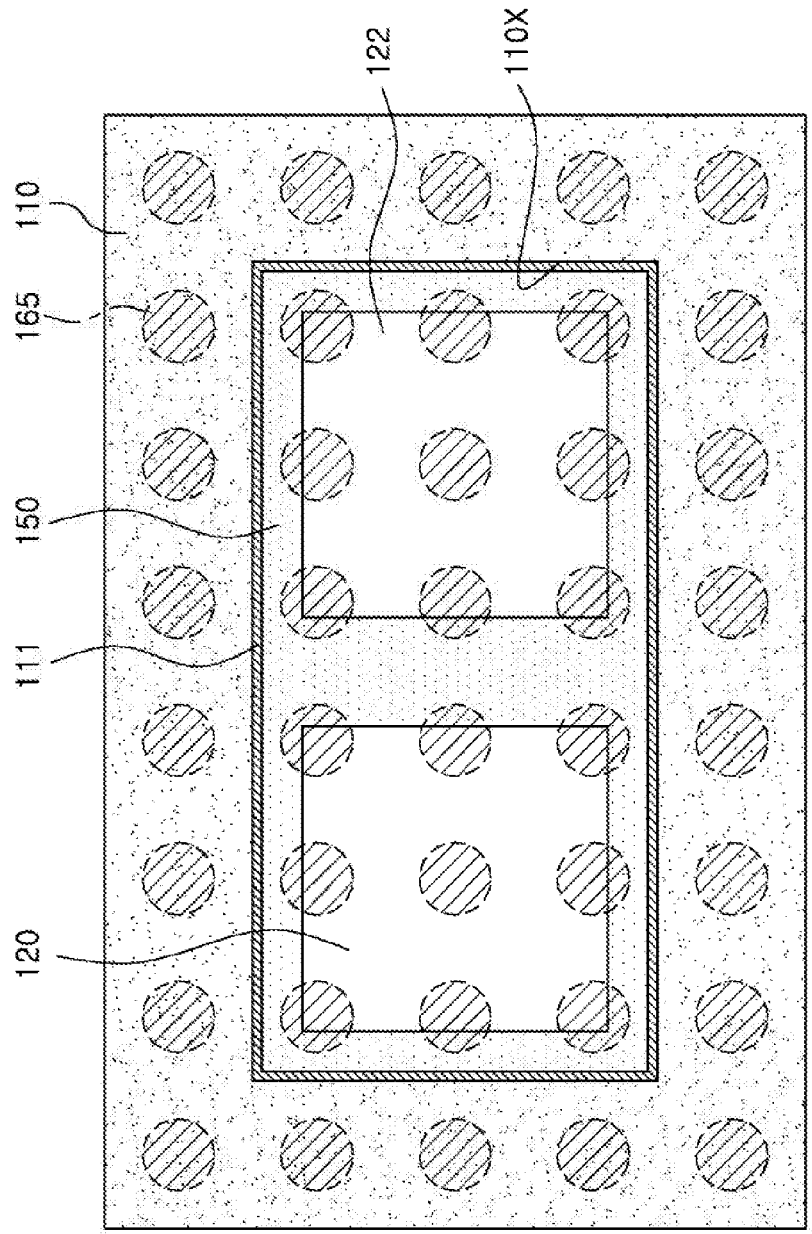
FIG. 21 is a schematic plan view of the electronic component package taken along line VI-VI' of FIG. 20.

FIG. 20 is a cross-sectional view schematically illustrating another example of an electronic component package. FIG. 21 is a schematic plan view of the electronic component package taken along line VI-VI' of FIG. 20. Referring to FIGS. 20 and 21, an electronic component package 100F according to another example may include a frame 110 having a through-hole 110X, electronic components 120 and 122 disposed in the through-hole 110X, an insulating part 150 at least covering upper portions of the frame 110 and the electronic components 120 and 122, a bonding part 111 at least partially disposed between the frame 110 and the insulating part 150, and redistribution parts 130 and 140 disposed below the frame 110 and the electronic components 120 and 122, wherein the number of electronic components 120 and 122 is plural.

The plurality of electronic components 120 and 122 may be the same as or different from each other. The plurality of electronic components 120 and 122 may have electrode pads 120P and 122P electrically connected to the redistribution parts 130 and 140, respectively. The electrode pads 120P and 122P may be redistributed by the redistribution parts 130 and 140, respectively. The number, an interval, a disposition form, and the like, of electronic components 120 and 122 are not particularly limited, and may be sufficiently modified depending on design particulars by those skilled in the art. For example, the number of electronic components 120 and 122 may be two as illustrated in FIGS. 20 and 21. However, the number of electronic components 120 and 122 is not limited thereto, and may be two or more, such as three, four, or the like. Since respective components included in the electronic component package 100F according to another example are the same as the components described above, a description thereof will be omitted. In addition, since a method of manufacturing the electronic component package 100F according to another example is the same as the methods of manufacturing the electronic component packages 100A to 100E described above except that the plurality of electronic components 120 and 122 are disposed, a description thereof will be omitted. Meanwhile, unlike as illustrated in FIGS. 20 and 21, the electronic component package 100F according to another example may also be modified so that characteristic forms of the electronic component packages 100B to 100E described above are applied thereto.

Figure 22:
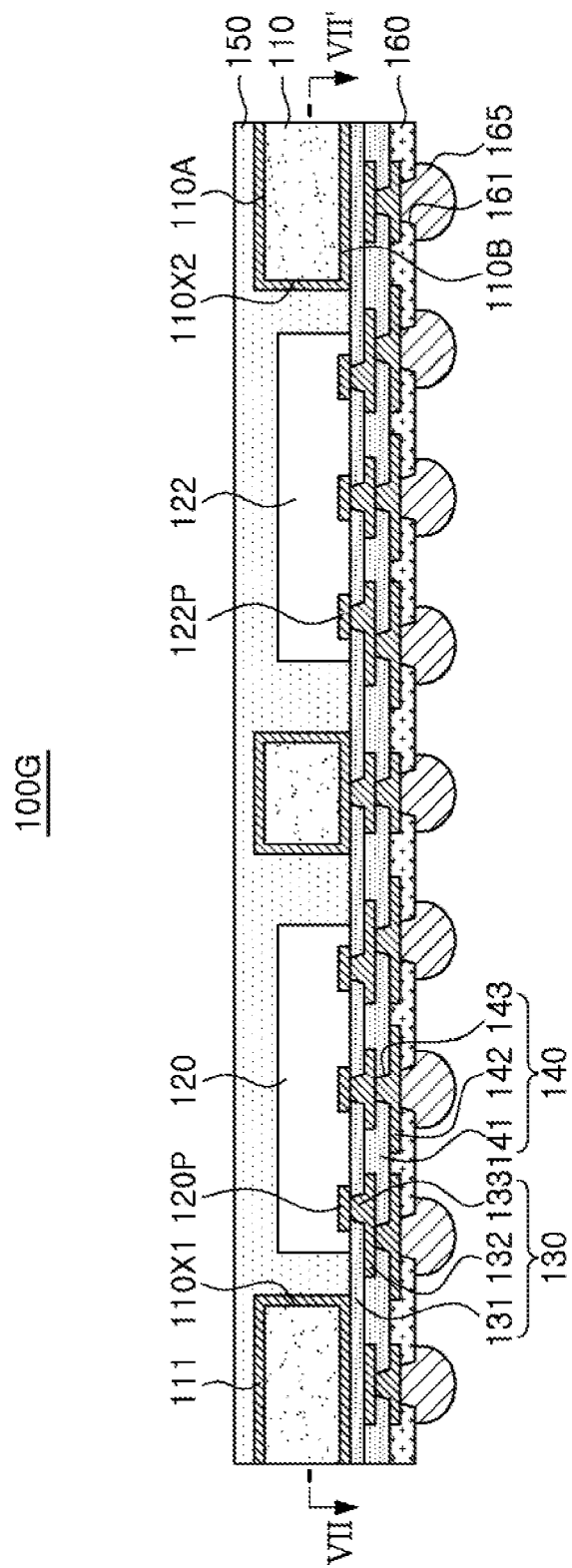
FIG. 22 is a cross-sectional view schematically illustrating another example of an electronic component package.
Figure 23:
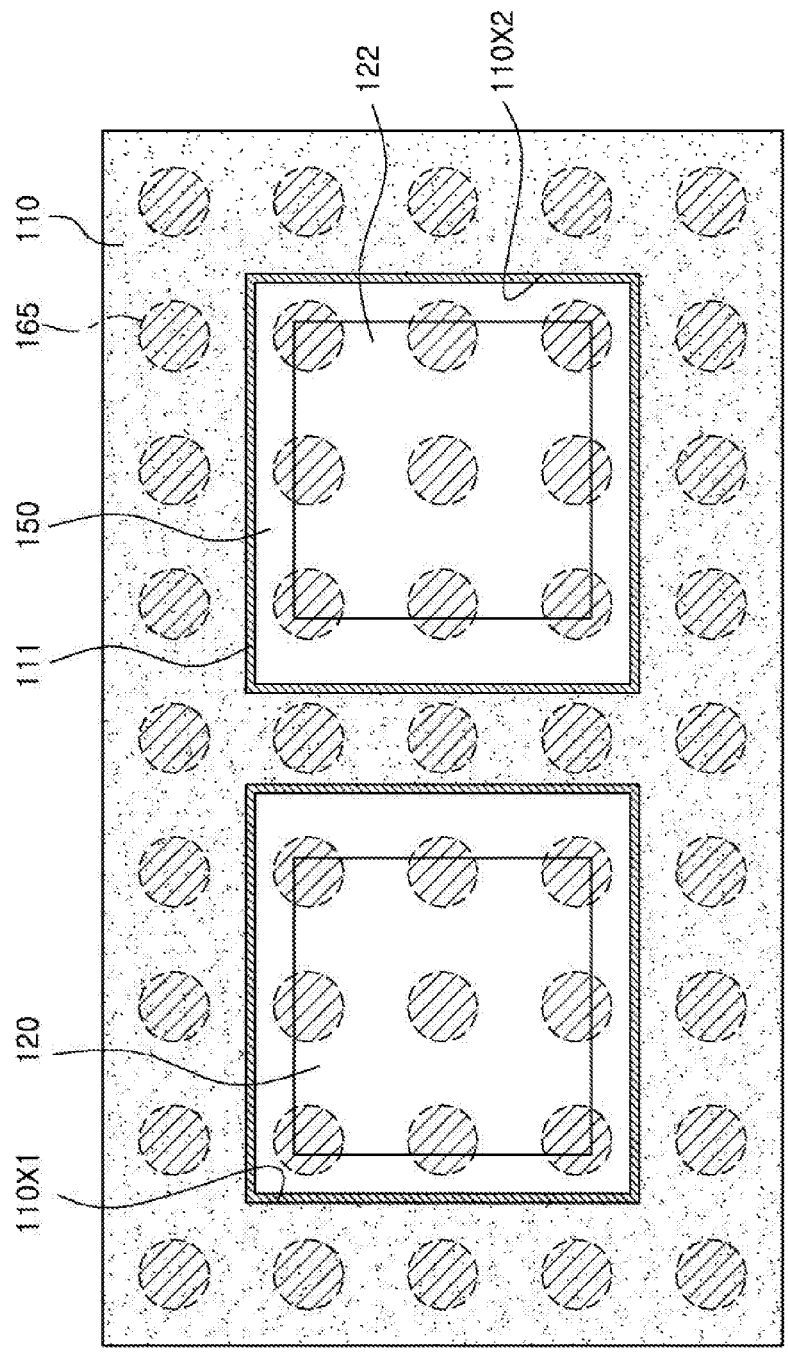
FIG. 23 is a schematic plan view of the electronic component package taken along line VII-VII' of FIG. 22.

FIG. 22 is a cross-sectional view schematically illustrating another example of an electronic component package. FIG. 23 is a schematic plan view of the electronic component package taken along line VII-VII' of FIG. 22. Referring to FIGS. 22 and 23, an electronic component package 100G according to another example may include a frame 110 having through-holes 110X1 and 110X2, electronic components 120 and 122 each disposed in the through-holes 110X1 and 110X2, an insulating part 150 at least covering upper portions of the frame 110 and the electronic components 120 and 122, a bonding part 111 at least partially disposed between the frame 110 and the insulating part 150, and redistribution parts 130 and 140 disposed below the frame 110 and the electronic components 120 and 122, wherein the number of through-holes 110X1 and 110X2 is plural, and the electronic components 120 and 122 are disposed in the through-holes 110X1 and 110X2, respectively.

Areas, shapes, or the like, of the plurality of through-holes 110X1 and 110X2 may be the same as or different from each other, and the electronic components 120 and 122 each disposed in the through-holes 110X1 and 110X2 may also be the same as or different from each other. The numbers, intervals, disposition forms, and the like, of through-holes 110X1 and 110X2 and electronic components 120 and 122 each disposed in the through-holes 110X1 and 110X2 are not particularly limited, and may be sufficiently modified depending on design particulars by those skilled in the art. For example, the number of through-holes 110X1 and 110X2 may be two as illustrated in FIGS. 22 and 23. However, the number of through-holes 110X1 and 110X2 is not limited thereto, and may be two or more, such as three, four, or the like. In addition, the number of electronic components 120 and 122 each disposed in the through-holes 110X1 and 110X2 may be one as illustrated in FIGS. 22 and 23. However, the number of electronic components 120 and 122 each disposed in the through-holes 110X1 and 110X2 is not limited thereto, and may be one or more, such as two, three, or the like. Since respective components included in the electronic component package 100G according to another example are the same as the components described above, a description thereof will be omitted. In addition, since a method of manufacturing the electronic component package 100G according to another example is the same as the methods of manufacturing the electronic component packages 100A to 100E described above except that the plurality of through-holes 110X1 and 110X2 are formed and the plurality of electronic components 120 and 122 are disposed in the plurality of through-holes 110X1 and 110X2, respectively, a description thereof will be omitted. Meanwhile, unlike as illustrated in FIGS. 22 and 23, the electronic component package 100G according to another example may also be modified so that characteristic forms of the electronic component packages 100B to 100F described above are applied thereto.

Figure 24:
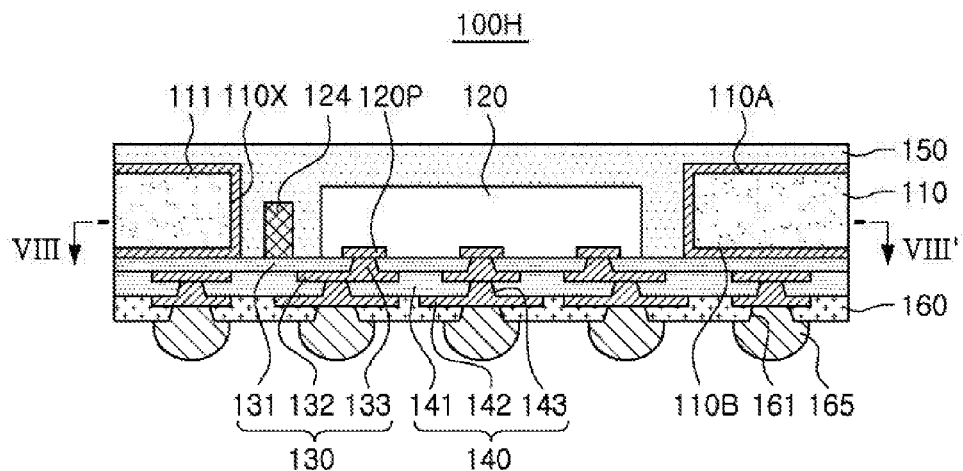
FIG. 24 is a cross-sectional view schematically illustrating another example of an electronic component package.
Figure 25:
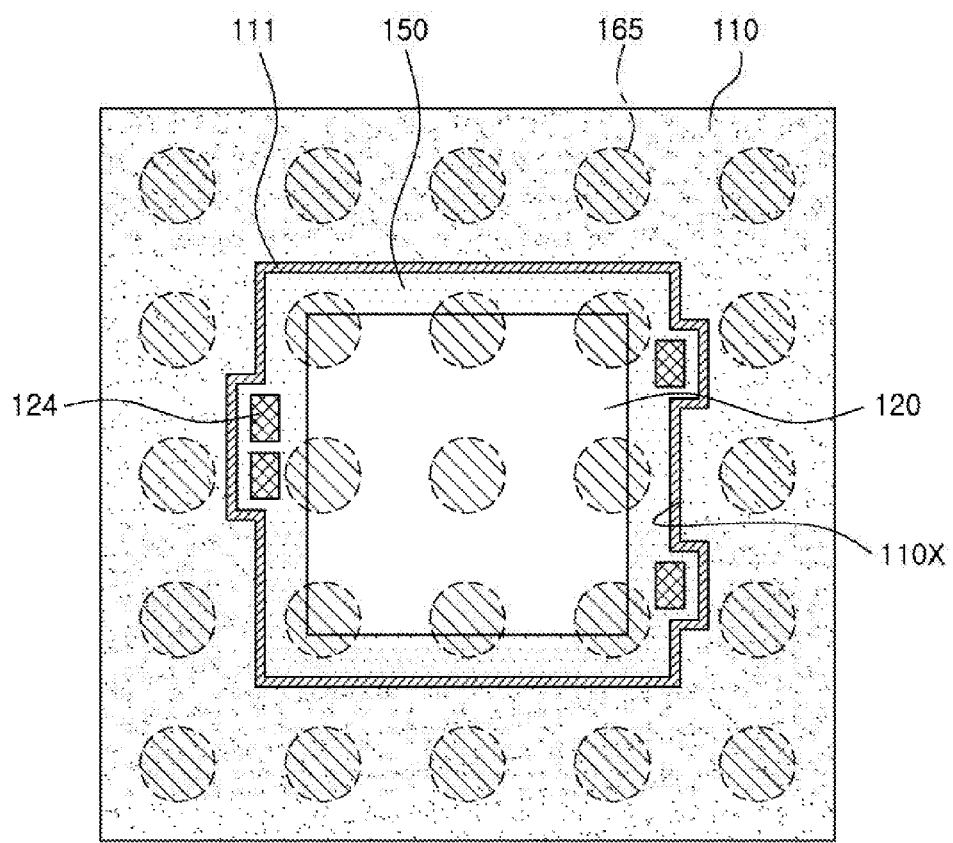
FIG. 25 is a schematic plan view of the electronic component package taken along line VIII-VIII' of FIG. 24.

FIG. 24 is a cross-sectional view schematically illustrating another example of an electronic component package. FIG. 25 is a schematic plan view of the electronic component package taken along line VIII-VIII' of FIG. 24. Referring to FIGS. 24 and 25, an electronic component package 100H according to another example may include a frame 110 having a through-hole 110X, electronic components 120 and 124 disposed in the through-hole 110X, an insulating part 150 at least covering upper portions of the frame 110 and the electronic components 120 and 124, a bonding part 111 at least partially disposed between the frame 110 and the insulating part 150, and redistribution parts 130 and 140 disposed below the frame 110 and the electronic components 120 and 124, wherein at least one of the electronic component 120 and 124 is an integrated circuit 120, and the other of the electronic components 120 and 124 is a passive component 124.

The integrated circuit 120 indicates a chip in which hundreds to millions or more of elements are integrated, and may be, for example, an application processor chip such as a central processor (for example, a CPU), a graphics processor (for example, a GPU), a digital signal processor, a cryptographic processor, a micro processor, a micro controller, or the like, but is not limited thereto. The passive component 124 may be, for example, an inductor, a condenser, a resistor, or the like, but is not limited thereto. The integrated circuit 120 may be electrically connected to the redistribution parts 130 and 140 through electrode pads 120P. The passive component 124 may be electrically connected to the redistribution parts 130 and 140 through electrode pads (not illustrated), for example, external electrodes. The numbers, intervals, disposition forms, and the like, of integrated circuits 120 and passive components 124 are not particularly limited, and may be sufficiently modified depending on design particulars by those skilled in the art. For example, the integrated circuit 120 and the passive component 124 may be disposed in the vicinity of the center of the through-hole 110X and in the vicinity of an inner wall of the through-hole 110X, respectively, but are not limited thereto. In addition, the number of integrated circuits 120 may be one and the number of passive components 124 may be plural. However, the numbers of integrated circuits 120 and passive components 124 are not limited thereto. For example, the number of integrated circuits 120 may be plural and the number of passive components 124 may be one, the numbers of both of integrated circuits 120 and passive components 124 may be one, or the numbers of both of integrated circuits 120 and passive components 124 may be plural. Since respective components included in the electronic component package 100H according to another example are the same as the components described above, a description thereof will be omitted. In addition, since a method of manufacturing the electronic component package 100H according to another example is the same as the methods of manufacturing the electronic component packages 100A to 100E described above except that the plurality of electronic components 120 and 124 are disposed, a description thereof will be omitted. Meanwhile, unlike as illustrated in FIGS. 24 and 25, the electronic component package 100H according to another example may also be modified so that characteristic forms of the electronic component packages 100B to 100G described above are applied thereto.

Figure 26:
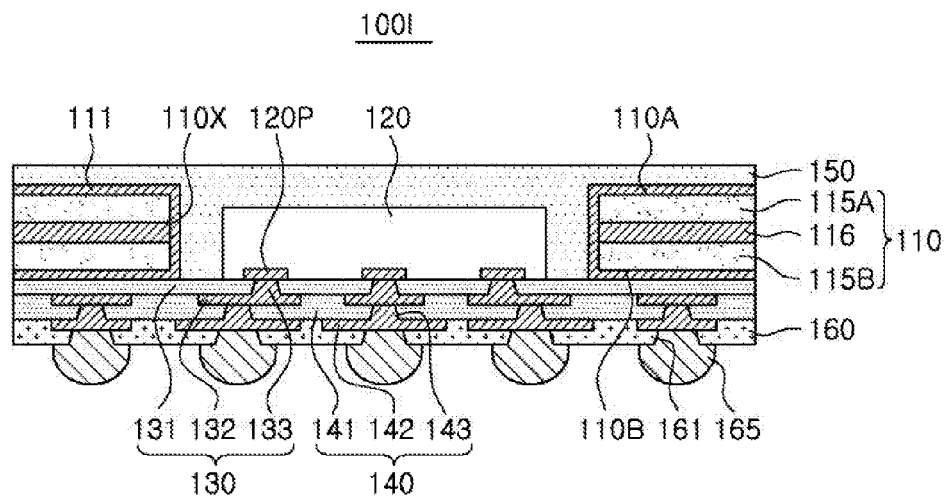
FIG. 26 is a cross-sectional view schematically illustrating another example of an electronic component package.

FIG. 26 is a cross-sectional view schematically illustrating another example of an electronic component package. Referring to FIG. 26, an electronic component package 100I according to another example may include a frame 110 having a through-hole 110X, an electronic component 120 disposed in the through-hole 110X, an insulating part 150 at least covering upper portions of the frame 110 and the electronic component 120, a bonding part 111 at least partially disposed between the frame 110 and the insulating part 150, and redistribution parts 130 and 140 disposed below the frame 110 and the electronic component 120. The frame 110 may include a heat dissipation layer 116 disposed therein, and a metal or ceramic based material forming the frame 110 may be divided into a plurality of layers 115A and 115B by the heat dissipation layer 116.

The heat dissipation layer 116 may be formed of a conductive material, such as copper (Cu), aluminum (Al), silver (Ag), tin (Sn), gold (Au), nickel (Ni), lead (Pd), or alloys thereof. The heat dissipation layer 116 may have a thermal conductivity greater than that of the metal or ceramic based material for forming the remaining portion of the frame 110. Therefore, in a case in which the frame 110 includes the heat dissipation layer 116, heat dissipation characteristics may be further improved. Since respective components included in the electronic component package 100I according to another example are the same as the components described above, a description thereof will be omitted. In addition, since a method of manufacturing the electronic component package 100I according to another example is the same as the methods of manufacturing the electronic component packages 100A to 100E described above except that the heat dissipation layer 116 is disposed in the frame 110, a description thereof will be omitted. Meanwhile, unlike as illustrated in FIG. 26, the electronic component package 100I according to another example may also be modified so that characteristic forms of the electronic component packages 100B to 100H described above are applied thereto.

Figure 27:
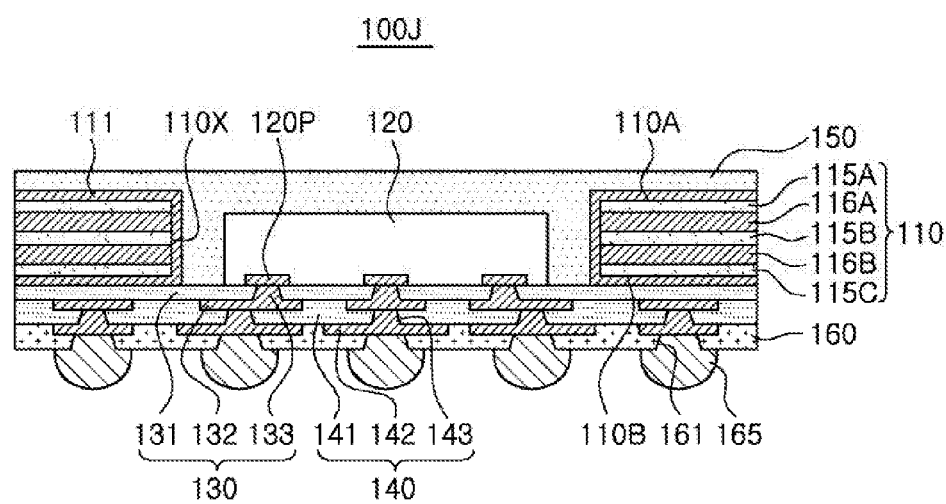
FIG. 27 is a cross-sectional view schematically illustrating another example of an electronic component package.

FIG. 27 is a cross-sectional view schematically illustrating another example of an electronic component package. Referring to FIG. 27, an electronic component package 100J according to another example may include a frame 110 having a through-hole 110X, an electronic component 120 disposed in the through-hole 110X, an insulating part 150 at least covering upper portions of the frame 110 and the electronic component 120, a bonding part 111 at least partially disposed between the frame 110 and the insulating part 150, and redistribution parts 130 and 140 disposed below the frame 110 and the electronic component 120. The frame 110 may include a plurality of heat dissipation layers 116A and 116B disposed therein, and a metal or ceramic based material forming the frame 110 may be divided into a plurality of layers 115A, 115B, and 115C by the plurality of heat dissipation layers 116A and 116B.

The respective heat dissipation layers 116A and 116B may be formed of a conductive material, such as copper (Cu), aluminum (Al), silver (Ag), tin (Sn), gold (Au), nickel (Ni), lead (Pd), or alloys thereof. The heat dissipation layers 116A and 116B may have a thermal conductivity greater than that of the metal or ceramic based material for forming the remaining portion of the frame 110. Therefore, in a case in which the frame 110 includes the heat dissipation layers 116A and 116B, heat dissipation characteristics may be further improved. The number of heat dissipation layers 116A and 116B may be more than the number of heat dissipation layers illustrated in FIG. 27. Since respective components included in the electronic component package 100J according to another example are the same as the components described above, a description thereof will be omitted. In addition, since a method of manufacturing the electronic component package 100J according to another example is the same as the methods of manufacturing the electronic component packages 100A to 100E described above except that the plurality of heat dissipation layers 116A and 116B are disposed in the frame 110, a description thereof will be omitted. Meanwhile, unlike as illustrated in FIG. 27, the electronic component package 100J according to another example may also be modified so that characteristic forms of the electronic component packages 100B to 100H described above are applied thereto.

Package-on-Package Structure

Figure 28:
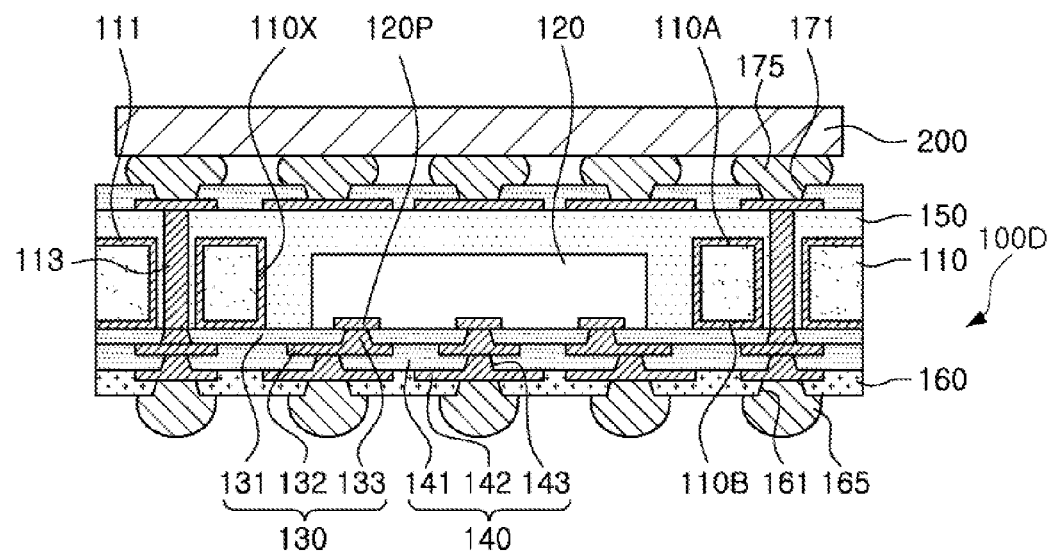
FIG. 28 is a cross-sectional view schematically illustrating an example of a package-on-package structure.

FIG. 28 is a cross-sectional view schematically illustrating an example of a package-on-package structure. The electronic component packages 100A to 100H according to the various examples described above may be applied in various forms to a package-on-package structure. For example, referring to FIG. 28, the package-on-package structure according to an example may have a form in which another electronic component package 200 is disposed above the electronic component package 100D described above.

Referring to FIG. 28, a first electronic component package 100D may include the frame 110 having the through-hole 110X, the electronic component 120 disposed in the through-hole 110X, the insulating part 150 at least covering the upper portions of the frame 110 and the electronic component 120, the bonding part 111 at least partially disposed between the frame 110 and the insulating part 150, the through-wirings 113 penetrating through the frame 110, the redistribution parts 130 and 140 disposed below the frame 110 and the electronic component 120, the first external connection terminals 165 disposed below the redistribution parts 130 and 140, and the second external connection terminals 175 disposed above the insulating part 150, as described above. Since the respective components are the same as the components described above, a description thereof will be omitted.

A second electronic component package 200 may be disposed above the first electronic component package 100D, and may be connected to the first electronic component package 100D through the second external connection terminals 175. The second electronic component package 200 may be a known electronic component package, and a structure or a form of the second electronic component package 200 is not particularly limited. As an example, the second electronic component package 200 may be a memory chip package in which a memory chip such as a volatile memory (such as a DRAM), a non-volatile memory (such as a ROM), a flash memory, or the like is mounted in a flip-chip form, but is not limited thereto.

Figure 29:
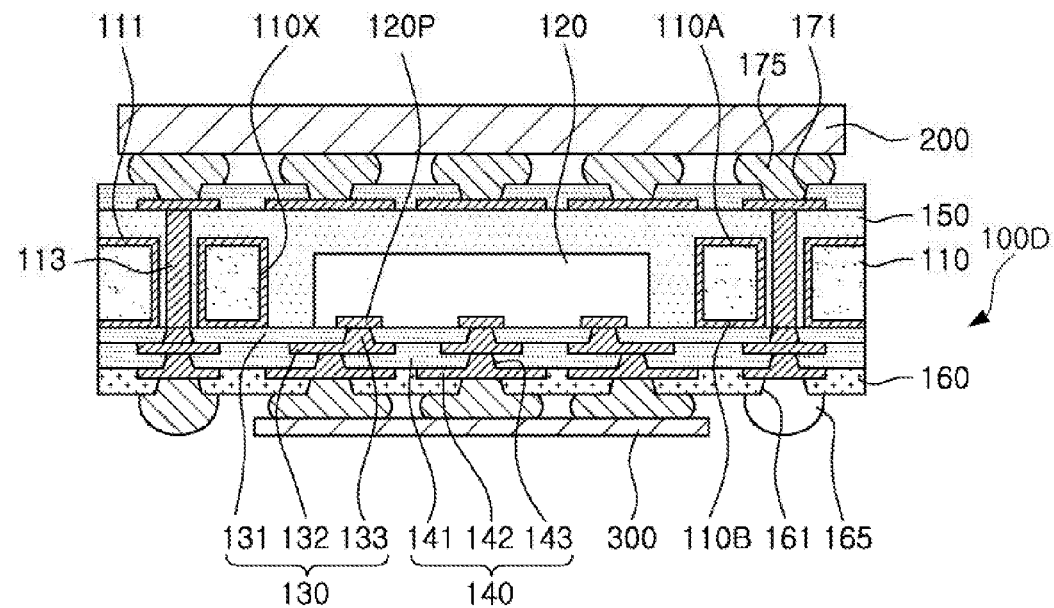
FIG. 29 is a cross-sectional view schematically illustrating another example of a package-on-package structure.

FIG. 29 is a cross-sectional view schematically illustrating another example of a package-on-package structure. For example, referring to FIG. 29, the package-on-package structure according to another example may have a form in which other electronic component packages 200 and 300 are disposed above and below the electronic component package 100D described above, respectively.

Referring to FIG. 29, a first electronic component package 100D may include the frame 110 having the through-hole 110X, the electronic component 120 disposed in the through-hole 110X, the insulating part 150 at least covering the upper portions of the frame 110 and the electronic component 120, the bonding part 111 at least partially disposed between the frame 110 and the insulating part 150, the through-wirings 113 penetrating through the frame 110, the redistribution parts 130 and 140 disposed below the frame 110 and the electronic component 120, the first external connection terminals 165 disposed below the redistribution parts 130 and 140, and the second external connection terminals 175 disposed above the insulating part 150, as described above. Since the respective components are the same as the components described above, a description thereof will be omitted.

A second electronic component package 200 may be disposed above the first electronic component package 100D, and may be connected to the first electronic component package 100D through the second external connection terminals 175, as described above. The second electronic component package 200 may be a known electronic component package, and a structure or a form of the second electronic component package 200 is not particularly limited. As an example, the second electronic component package 200 may be a memory chip package in which a memory chip such as a volatile memory (such as a DRAM), a non-volatile memory (such as a ROM), a flash memory, or the like is mounted, but is not limited thereto. Alternatively, the second electronic component package 200 may also be any one of the electronic component packages 100A to 100H described above.

A third electronic component package 300 may be disposed below the first electronic component package 100D, and may be connected to the first electronic component package 100D through the first external connection terminals 165. The third electronic component package 300 may also be a known electronic component package, and a structure or a form of the third electronic component package 300 is not particularly limited. As an example, the third electronic component package 300 may also be a memory chip package in which a memory chip such as a volatile memory (such as a DRAM), a non-volatile memory (such as a ROM), a flash memory, or the like is mounted, but is not limited thereto. Alternatively, the third electronic component package 300 may also be any one of the electronic component packages 100A to 100H described above.

Although not illustrated in FIG. 29, various separate passive components (not illustrated), such as surface-mounting technology (SMT) components, may be disposed on a surface of the first electronic component package 100D. In addition, several types of electronic component packages 100A to 100H or several other types of electronic component packages (not illustrated in FIG. 29) may be disposed together with passive components as upper packages. The passive components (not illustrated) may also be disposed in the second opening parts 171, and may be physically and/or electrically connected to various conductive patterns exposed through the second opening parts 171.

As set forth above, according to an exemplary embodiment in the present disclosure, an electronic component package having improved heat dissipation and warpage characteristics, and a package-on-package structure including the same, may be provided.

Meanwhile, in the present disclosure, a term. "lower portion" has been used to indicate a direction in which the electronic component package is mounted in the electronic device, a term "upper portion" has been used to indicate an opposite direction to the direction indicated by the term "lower portion", and a term "side portion" has been used to indicate a direction perpendicular to the directions indicated by the terms "upper portion and lower portion". Here, a phrase "positioned at the upper portion, the lower portion, or the side portion" includes a case in which a target component is positioned in a corresponding direction, but does not directly contact a reference component, that is, a case in which the target component indirectly contacts the reference component, as well as a case in which the target component directly contacts the reference component.

Meanwhile, in the present disclosure, terms "first", "second", and the like, are used to distinguish one component from another component, and do not limit a sequence, importance, and the like, of the corresponding components. In some cases, a first component may be named a second component and a second component may also be similarly named a first component, without departing from the scope of the present disclosure.

Meanwhile, a term "example" used in the present disclosure does not mean the same exemplary embodiment, but is provided in order to emphasize and describe different unique features. However, the above suggested examples may also be implemented to be combined with a feature of another example. For example, even though particulars described in a specific example are not described in another example, it may be understood as a description related to another example unless described otherwise.

Meanwhile, terms used in the present disclosure are used only in order to describe an example rather than limiting the present disclosure. Here, singular forms include plural forms unless interpreted otherwise in a context.

While exemplary embodiments have been shown and described above, it will be apparent to those skilled in the art that modifications and variations could be made without departing from the scope of the present invention as defined by the appended claims.

What is claimed is:

1. An electronic component package comprising:
a frame containing a metal or ceramic based material and having a through-hole;
an electronic component disposed in the through-hole;
an insulating part at least covering upper portions of the frame and the electronic component;
an electrically conductive bonding part disposed on the frame and at least partially separating the insulating part from the frame; and
a redistribution part disposed below the frame and the electronic component,
wherein a lower surface of the electrically conductive bonding part is substantially coplanar with a lower surface of the insulating part and a lower surface of the electronic component facing the redistribution part.

2. The electronic component package of claim 1, wherein the metal based material is an Fe—Ni based alloy (Invar).

3. The electronic component package of claim 1, wherein the ceramic based material is at least one selected from the group consisting of a zirconia based ($ZrO_2$) material, an alumina based ($Al_2O_3$) material, a silicon carbide based (SiC) material, and a silicon nitride based ($Si_3N_4$) material.

4. The electronic component package of claim 1, wherein the metal or ceramic based material has thermal conductivity of 1 W/mK or more, a coefficient of thermal expansion (CTE) of 10 ppm/° C. or less, and an elastic modulus of 100 GPa or more.

5. The electronic component package of claim 1, wherein the frame includes any layer that is penetrated through by the through-hole in which the electronic component is disposed, and
any layer of the frame has a thermal conductivity of 1 W/mK or more, a coefficient of thermal expansion (CTE) of 10 ppm/° C. or less, and an elastic modulus of 100 GPa or more.

6. The electronic component package of claim 1, wherein the electrically conductive bonding part has a thermal conductivity greater than that of the metal or ceramic based material contained in the frame.

7. The electronic component package of claim 1, further comprising a through-wiring penetrating through the frame,
wherein an insulating material is disposed between the electrically conductive bonding part and the through-wiring.

8. The electronic component package of claim 1, wherein the insulating part encloses outer side portions of the frame, and
the frame is not externally exposed.

9. The electronic component package of claim 1, wherein the frame includes one or more heat dissipation layers including a conductive material disposed therein, and
the metal or ceramic based material is divided into a plurality of layers by the one or more the heat dissipation layers.

10. The electronic component package of claim 9, wherein the one or more heat dissipation layers have a thermal conductivity greater than that of the remaining portion of the frame.

11. The electronic component package of claim 1, further comprising:
an outer layer disposed below the redistribution part and having first opening parts; and
first external connection terminals disposed in the first opening parts,
wherein at least one of the first external connection terminals is disposed in a fan-out region.

12. The electronic component package of claim 1, further comprising:
a cover layer disposed above the insulating part and having second opening parts; and
second external connection terminals disposed in the second opening parts,
wherein the second external connection terminals are electrically connected to the electronic component.

13. The electronic component package of claim 1, wherein the electrically conductive bonding part extends between the frame and the redistribution part and completely separates the frame and the redistribution part from each other.

14. The electronic component package of claim 1, wherein the electrically conductive bonding part completely separates the frame and the insulating part from each other.

15. The electronic component package of claim 1, wherein the electrically conductive bonding part extends to and is disposed on an inner wall of the through-hole.

16. The electronic component package of claim 1, wherein the electrically conductive bonding part includes a first bonding part and a second bonding part,
the first bonding part is disposed on a lower surface of the frame and an upper surface thereof opposing the lower surface, and
the second bonding part is disposed on the first bonding part and extends to an inner wall of the through-hole.

17. The electronic component package of claim 1, wherein an inner wall of the through-hole is not covered by the electrically conductive bonding part.

18. The electronic component package of claim 1, wherein the redistribution part includes an insulating layer and conductive patterns disposed on the insulating layer,
wherein a lower surface of the frame facing the insulating layer of the redistribution part is completely covered by the electrically conductive bonding part, and
the lower surface of the electronic component, the lower surface of the insulating part, and the lower surface of the electrically conductive bonding part are in contact with the insulating layer of the redistribution part.

19. The electronic component package of claim 18, wherein the conductive patterns of the redistribution part are electrically connected to the electrode pads of the electronic component directly through vias penetrating through the insulating layer of the redistribution part.

20. A package-on-package structure comprising:
a first electronic component package including:
a frame containing a metal or ceramic based material and having a through-hole,
an electronic component disposed in the through-hole,
an insulating part at least covering upper portions of the frame and the electronic component,
an electrically conductive bonding part disposed on the frame and at least partially separating the insulating part from the frame,
a through-wiring penetrating through the frame,
a redistribution part disposed below the frame and the electronic component,
first external connection terminals disposed below the redistribution part, and
second external connection terminals disposed above the insulating part,
wherein a lower surface of the electrically conductive bonding part is substantially coplanar with a lower surface of the insulating part and a lower surface of the electronic component facing the redistribution part; and
a second electronic component package disposed above the first electronic component package and connected to the first electronic component package through the second external connection terminals.

21. The package-on-package structure of claim 20, further comprising a third electronic component package disposed below the first electronic component package and connected to the first electronic component package through the first external connection terminals.

22. The package-on-package structure of claim 20, wherein the frame includes any layer that is penetrated through by the through-hole in which the electronic component is disposed, and
any layer of the frame has a thermal conductivity of 1 W/mK or more, a coefficient of thermal expansion (CTE) of 10 ppm/° C. or less, and an elastic modulus of 100 GPa or more.

23. The package-on-package structure of claim 20, wherein the electrically conductive bonding part extends between the frame and the redistribution part and completely separates the frame and the redistribution part from each other.

24. The package-on-package structure of claim 20, wherein the frame contains an Fe—Ni based alloy (Invar).

25. An electronic component package comprising:
a frame having a through-hole;
a bonding part disposed on at least one surface of the frame;
an electronic component disposed in the through-hole of the frame;
a redistribution part, on which the frame and the electronic component are disposed, including an insulating layer, and conductive patterns disposed on the insulating layer and electrically connected to electrode pads of the electronic component directly through vias penetrating through the insulating layer of the redistribution part; and
an insulating part at least filling a portion of a space of the through-hole confined by the redistribution part, the electronic component, and the frame,
wherein
the bonding part is electrically conductive and at least partially separates the insulating part from the frame,
a lower surface of the electronic component, on which the electrode pads of the electronic components are disposed, and a lower surface of the insulating part are in contact with the insulating layer of the redistribution part, and
a lower surface of the frame facing the insulating layer of the redistribution part is completely covered by the bonding part.

26. The electronic component package of claim 25, wherein a material for forming the frame is a metal or ceramic based material.

27. The electronic component package of claim 25, wherein a thickness of a portion of the bonding part on an inner wall of the through-hole is less than a thickness of another portion of the bonding part on an upper surface or the lower surface of the frame, and
the inner wall connects the upper surface and the lower surface of the frame to each other.

28. The electronic component package of claim 25, wherein the frame contains an Fe—Ni based alloy (Invar).

29. The electronic component package of claim 25, wherein the frame has a thermal conductivity of 1 W/mK or more, a coefficient of thermal expansion (CTE) of 10 ppm/° C. or less, and an elastic modulus of 100 GPa or more.

* * * * *